(12) United States Patent
Blackburn et al.

(10) Patent No.: US 11,943,886 B2
(45) Date of Patent: Mar. 26, 2024

(54) ELECTRONIC ASSEMBLY INCLUDING A COMPRESSION ASSEMBLY FOR CABLE CONNECTOR MODULES

(71) Applicant: TE Connectivity Services GmbH, Schaffhausen (CH)

(72) Inventors: Christopher William Blackburn, Bothell, WA (US); Brian Patrick Costello, Scotts Valley, CA (US); Alex Michael Sharf, Harrisburg, PA (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 126 days.

(21) Appl. No.: 17/509,574

(22) Filed: Oct. 25, 2021

(65) Prior Publication Data

US 2022/0151095 A1    May 12, 2022

Related U.S. Application Data

(60) Provisional application No. 63/112,481, filed on Nov. 11, 2020.

(51) Int. Cl.
| | |
|---|---|
| *H05K 7/10* | (2006.01) |
| *H01R 12/52* | (2011.01) |
| *H01R 13/11* | (2006.01) |
| *H01R 13/24* | (2006.01) |
| *H05K 3/36* | (2006.01) |
| *H05K 7/20* | (2006.01) |

(52) U.S. Cl.
CPC .......... *H05K 7/1084* (2013.01); *H01R 12/52* (2013.01); *H01R 13/11* (2013.01); *H01R 13/24* (2013.01); *H05K 3/368* (2013.01); *H05K 7/20409* (2013.01); *H05K 7/20509* (2013.01); *H05K 2201/10378* (2013.01); *H05K 2201/10704* (2013.01)

(58) Field of Classification Search
CPC ............. H05K 7/1084; H05K 7/20409; H05K 7/20509; H05K 2201/10378; H01R 12/52; H01R 13/11; H01R 13/24
USPC .......................................................... 439/55
See application file for complete search history.

(56) References Cited

U.S. PATENT DOCUMENTS

| | | | | |
|---|---|---|---|---|
| 5,974,662 | A  * | 11/1999 | Eldridge | ............... H01L 21/563 257/E21.507 |
| 6,246,247 | B1 * | 6/2001 | Eldridge | ................. H01L 24/81 257/E21.507 |
| 7,656,172 | B2 * | 2/2010 | Andrews | ............ G01R 31/2891 324/755.11 |

(Continued)

*Primary Examiner* — Alexander Gilman

(57) ABSTRACT

An electronic assembly includes an electronic package having an integrated circuit component and interposer assemblies with compressible interposer contacts electrically connected thereto. Cable connector modules are coupled to the interposer assemblies. A cover assembly is coupled to the upper surface of the electronic package over the cable connector modules. The cover assembly includes bridge assemblies having plates in a plate stack that are independently movable. A load plate engages upper edges of the plates of the bridge assemblies and press against the plates to drive the bridge assemblies into the cable connector modules using compression hardware. The cable connector modules compress the interposer contacts of the interposer assemblies when the load plate presses the plates of the bridge assemblies into the cable connector modules.

25 Claims, 22 Drawing Sheets

(56) References Cited

U.S. PATENT DOCUMENTS

| | | | | |
|---|---|---|---|---|
| 7,663,386 | B2* | 2/2010 | Hosaka | G01R 1/07342 |
| | | | | 324/756.03 |
| 7,791,361 | B2* | 9/2010 | Karklin | G01R 1/07364 |
| | | | | 324/762.01 |
| 7,898,272 | B2* | 3/2011 | Sasaki | G01R 31/2889 |
| | | | | 324/754.07 |
| 7,956,627 | B2* | 6/2011 | Kasukabe | G01R 3/00 |
| | | | | 324/750.22 |
| 8,069,491 | B2* | 11/2011 | Lesher | G01R 35/007 |
| | | | | 850/19 |
| 9,651,577 | B2* | 5/2017 | Joo | G01R 1/07378 |
| 9,793,226 | B2* | 10/2017 | Warwick | G01R 31/31905 |
| 11,150,268 | B2* | 10/2021 | Ito | H01R 12/7047 |
| 11,251,171 | B2* | 2/2022 | Rifani | G02B 6/4214 |
| 2002/0053734 | A1* | 5/2002 | Eldridge | G01R 1/07342 |
| | | | | 257/E23.024 |
| 2002/0067181 | A1* | 6/2002 | Eldridge | H05K 3/4015 |
| | | | | 257/E21.507 |
| 2009/0120668 | A1* | 5/2009 | Fjelstad | H01R 12/7082 |
| | | | | 174/250 |
| 2021/0274673 | A1 | 9/2021 | Blackburn et al. | |
| 2022/0151095 | A1* | 5/2022 | Blackburn | H05K 7/20509 |

\* cited by examiner

ELECTRONIC ASSEMBLY INCLUDING A COMPRESSION ASSEMBLY FOR CABLE CONNECTOR MODULES

CROSS REFERENCE TO RELATED APPLICATIONS

This application claims benefit to U.S. Provisional Application No. 63/112,481, filed Nov. 11, 2020, titled "ELECTRONIC ASSEMBLY INCLUDING A COMPRESSION ASSEMBLY FOR CABLE CONNECTOR MODULES", the subject matter of which is herein incorporated by reference in its entirety.

BACKGROUND OF THE INVENTION

The subject matter herein relates generally to electronic assemblies.

There is an ongoing trend toward smaller, lighter, and higher performance communication components and higher density systems, such as for ethernet switches or other system components. Typically, the system includes a socket connector mounted to a host circuit board. The socket connector receives an electronic package, such as an ASIC. Electrical signals are routed between the ASIC and the host circuit board through the socket connector. The electrical signals are then routed along traces on the host circuit board to another component, such as a transceiver connector. The long electrical paths through the host circuit board reduce electrical performance of the system. Additionally, the routing of the circuits between the socket connector and the other components on the host circuit board occupies board space on the host circuit board. Conventional systems are struggling with meeting signal output requirements from the electronic package because there is a need for shorter signal path lengths and higher number of conductors while maintaining good electrical performance through the system.

A need remains for a reliable electronic assembly for high speed data signaling for data communication systems.

BRIEF DESCRIPTION OF THE INVENTION

In one embodiment, an electronic assembly is provided. The electronic assembly includes an electronic package including a package substrate that has an upper surface and a lower surface. The electronic package includes an integrated circuit component on the upper surface of the package substrate. The electronic package includes lower package contacts electrically connected to the integrated circuit component and is configured to be electrically connected to a host circuit board. The electronic package includes upper package contacts electrically connected to the integrated circuit component. The electronic assembly includes interposer assemblies electrically connected to the electronic package. Each interposer assembly includes an array of interposer contacts. The interposer contacts are compressible. Each interposer contact has an upper mating interface and a lower mating interface. The lower mating interfaces of the interposer contacts are mated with the corresponding upper package contacts. The interposer assemblies defines separable interfaces with the electronic package. The electronic assembly includes cable connector modules coupled to the interposer assemblies. Each cable connector module includes a cable connector housing holding a connector module substrate. Each cable connector module has a cable extending from the cable connector module and is communicatively coupled to the connector module substrate. The connector module substrate has cable connector module contacts. The cable connector module contacts are mated with the upper mating interfaces of the corresponding interposer contacts. The electronic assembly includes a cover assembly coupled to the upper surface of the electronic package. The cover assembly includes a cover having a plate and separating walls extending from the plate to form connector module cavities configured to receive corresponding cable connector modules. The plate includes windows associated with each connector module cavity. The cover assembly includes bridge assemblies received in corresponding connector module cavities and extending through the corresponding windows. Each bridge assembly has a plurality of plates arranged in a plate stack. The plates are independently movable relative to each other within the plate stack. The plates include upper edges and lower edges. The lower edges engages the cable connector module housing. The electronic assembly includes a load plate coupled to the cover assembly using compression hardware. The load plate has a bottom surface engaging the upper edges of the plates of the bridge assemblies. The load plate presses against the plates of the bridge assemblies to drive the bridge assemblies into the cable connector modules using the compression hardware. The cable connector modules compress the interposer contacts of the interposer assemblies when the load plate presses the plates of the bridge assemblies into the cable connector modules.

In another embodiment, a compression assembly for an electronic package of a communication system is provided. The compression assembly includes a cover assembly configured to be coupled to an upper surface of the electronic package over interposer assemblies and cable connector modules coupled to the upper surface of the electronic package. The cover assembly includes a cover that has a plate and separating walls extending from the plate to form connector module cavities configured to receive corresponding cable connector modules. The plate includes windows associated with each connector module cavity. The compression assembly includes bridge assemblies received in corresponding connector module cavities and extending through the corresponding windows. Each bridge assembly has a plurality of plates arranged in a plate stack. The plates are independently movable relative to each other within the plate stack. The plates include upper edges and lower edges. The lower edges are configured to engage the cable connector module housing. The compression assembly includes a load plate coupled to the cover assembly using compression hardware that imparts a compression force. The load plate has a bottom surface engaging the upper edges of the plates of the bridge assemblies. The load plate presses against the plates of the bridge assemblies with the compression force to drive the bridge assemblies into the cable connector modules. The compression force is configured to compress interposer contacts of the interposer assemblies when the load plate presses the plates of the bridge assemblies into the cable connector modules.

In a further embodiment, a communication system is provided. The communication system includes a host circuit board having an upper surface. The host circuit board includes board contacts. The host circuit board includes a board connector electrically coupled to the board contacts. The communication system includes a bolster plate coupled to the host circuit board. The communication system includes an electronic assembly coupled to at least one of the host circuit board and the bolster plate. The electronic assembly includes an electronic package including a package substrate having an upper surface and a lower surface.

The electronic package includes an integrated circuit component on the upper surface of the package substrate. The electronic package includes lower package contacts electrically connected to the integrated circuit component. The lower package contacts are electrically connected to the board connector. The electronic package includes upper package contacts electrically connected to the integrated circuit component. The electronic assembly includes interposer assemblies electrically connected to the electronic package. Each interposer assembly includes an array of interposer contacts. The interposer contacts are compressible. Each interposer contact has an upper mating interface and a lower mating interface. The lower mating interfaces of the interposer contacts are mated with the corresponding upper package contacts. The interposer assemblies define separable interfaces with the electronic package. The electronic assembly includes cable connector modules coupled to the interposer assemblies. Each cable connector module includes a cable connector housing holding a connector module substrate. Each cable connector module has a cable extending from the cable connector module and is communicatively coupled to the connector module substrate. The connector module substrate has cable connector module contacts. The cable connector module contacts are mated with the upper mating interfaces of the corresponding interposer contacts. The electronic assembly includes a cover assembly coupled to the bolster plate above the upper surface of the electronic package. The cover assembly includes a cover has a plate and separating walls extending from the plate to form connector module cavities configured to receive corresponding cable connector modules. The plate includes windows associated with each connector module cavity. The cover assembly includes bridge assemblies received in corresponding connector module cavities and extending through the corresponding windows. Each bridge assembly has a plurality of plates arranged in a plate stack. The plates are independently movable relative to each other within the plate stack. The plates includes upper edges and lower edges. The lower edges engaging the cable connector module housing. The electronic assembly includes a load plate coupled to the cover assembly using compression hardware. The load plate has a bottom surface engaging the upper edges of the plates of the bridge assemblies. The load plate presses against the plates of the bridge assemblies to drive the bridge assemblies into the cable connector modules using the compression hardware. The cable connector modules compress the interposer contacts of the interposer assemblies when the load plate presses the plates of the bridge assemblies into the cable connector modules.

DETAILED DESCRIPTION OF THE INVENTION

Figure 1:
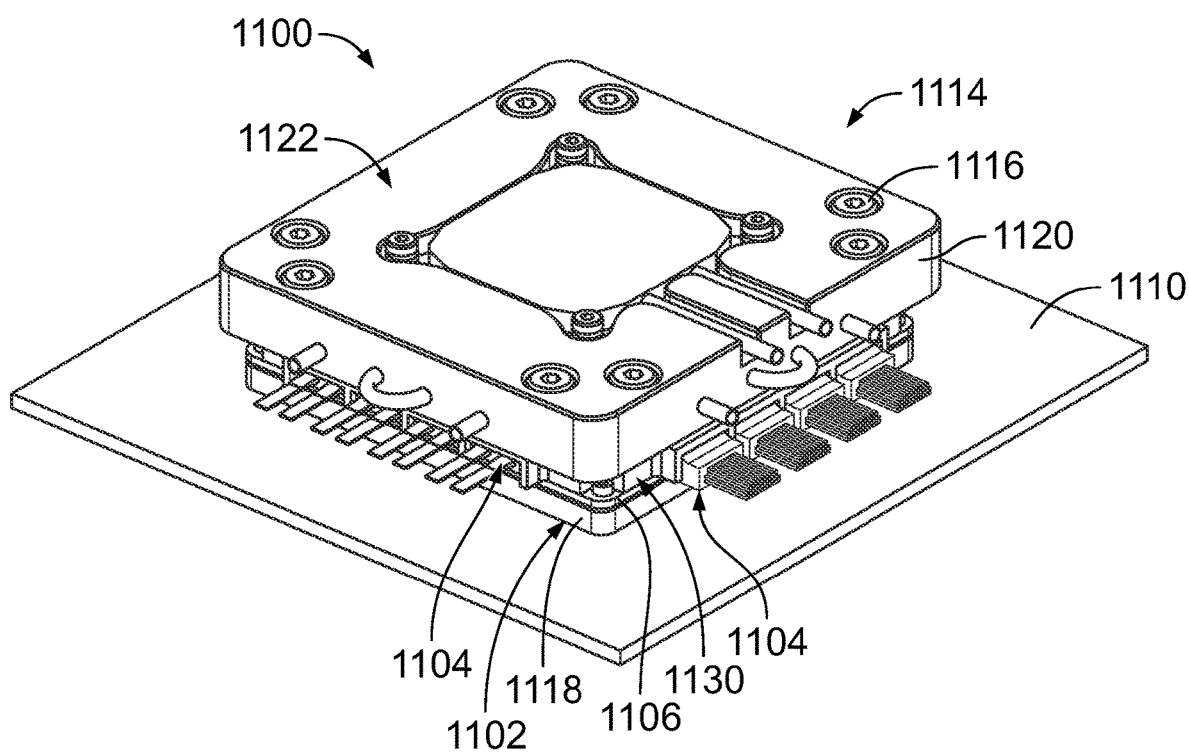
FIG. 1 is a perspective view of a communication system having an electronic assembly in accordance with an exemplary embodiment.
Figure 2:
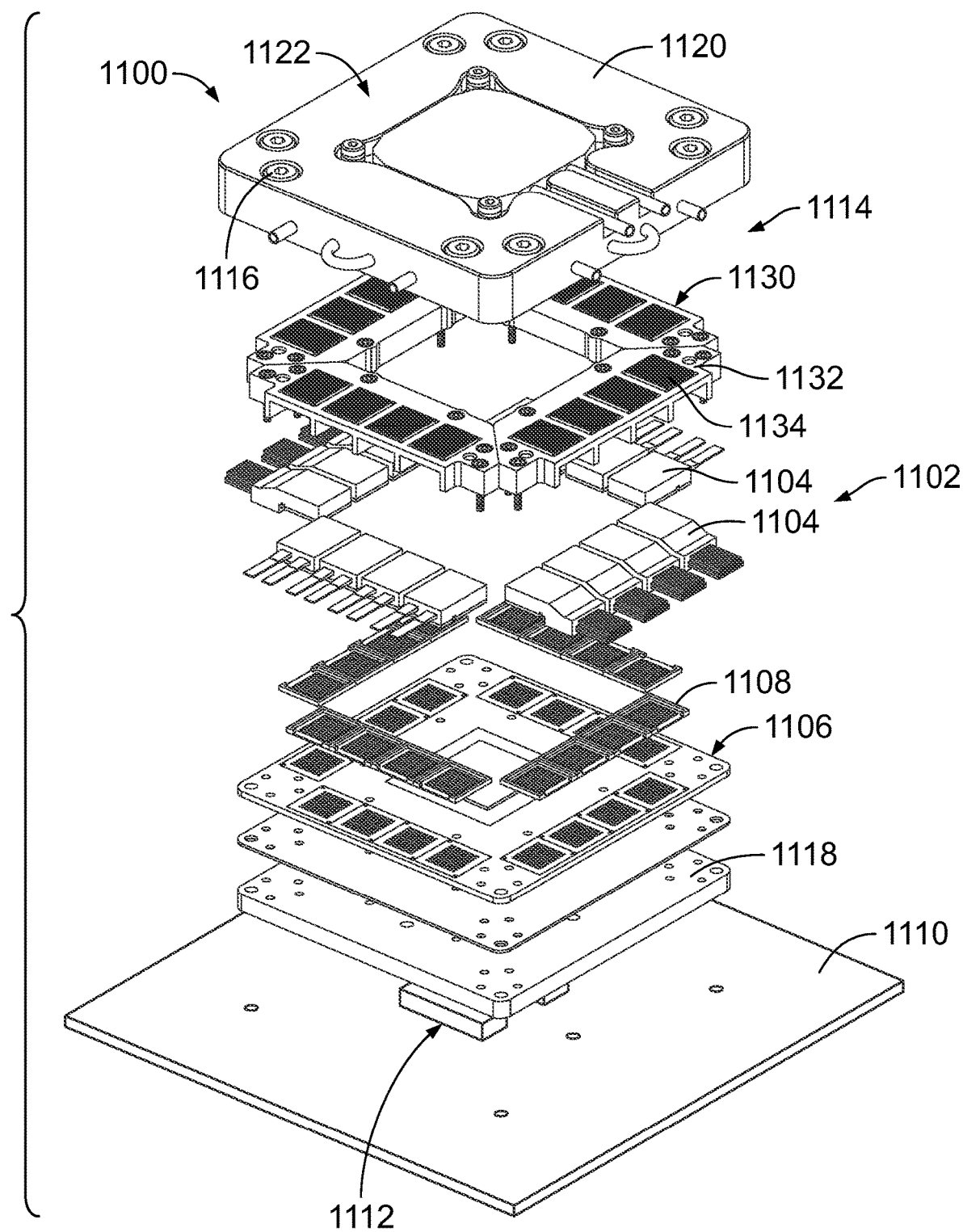
FIG. 2 is an exploded view of the communication system and the electronic assembly in accordance with an exemplary embodiment.

FIG. 1 is a perspective view of a communication system 1100 having an electronic assembly 1102 in accordance with an exemplary embodiment. FIG. 2 is an exploded view of the communication system 1100 and the electronic assembly 1102 in accordance with an exemplary embodiment. The electronic assembly 1102 includes cable connector modules 1104 (FIG. 2) electrically connected to an electronic package 1106 (FIG. 2) by interposer assemblies 1108 (FIG. 2). The electronic assembly 1102 is electrically connected to a host circuit board 1110, such as using a board connector 1112 (FIG. 2), which may transmit power and/or data between the host circuit board 1110 and the electronic assembly 1102. In other various embodiments, the electronic assembly 1102 may be mounted directly to the host circuit board 1110 without the use of the board connector 1112.

In an exemplary embodiment, a compression assembly 1114 is used to load the electronic assembly 1102 to the interposer assemblies 1108 to electrically connect the cable connector modules 1104 to the electronic package 1106. In an exemplary embodiment, the compression assembly 1114 includes a load plate 1120 used to press downward against various components of the electronic assembly 1102 to load the contacts of the electronic assembly 1102. Compression hardware 1116, such as threaded fasteners with biasing members (for example, springs), are used to couple the load plate 1120 to a bolster plate 1118. Optionally, an insulator 1128 may be provided between the bolster plate 1118 and the host circuit board 1110. The bolster plate 1118 may be located above the host circuit board 1110 in various embodiments. Alternatively, the bolster plate 1118 may be located below the host circuit board 1110. The load plate 1120 is forced downward to couple the cable connector modules 1104 to the interposer assemblies 1108. For example, the load plate 1120 may compress contacts of the interposer assemblies 1108. In an alternative embodiment, the load plate 1120 is coupled to the cover assembly 1130 and/or the bolster plate 1118 using fixed hardware rather than compression hardware to fix the position of the load plate 1120 relative to the electronic package 1106. In such embodiments, the compression of the cable connector modules 1104 may come from other compression members, such as internal springs. In an exemplary embodiment, the compression assembly 1114 includes a heat transfer element 1122 to dissipate heat from the electronic package 1106 and/or the cable connector modules 1104. The load plate 1120 may define the heat transfer element 1122. The heat transfer element 1122 may be a cold plate having cooling channels for active cooling of the cold plate. For example, the cooling channels may have liquid cooling to dissipate heat from the cold plate. In other various embodiments, the heat transfer element may be a heat sink having heat dissipating fins for passive cooling of the heat sink using airflow over the heat dissipating fins to dissipate heat from the heat sink.

In various embodiments, the electronic package 1106 is an integrated circuit assembly, such as an ASIC. However, the electronic package 1106 may be another type of communication component. The cable connector modules 1104 are mated directly to the ASIC via the interposer assemblies 1108 independent of the host circuit board 1110. For example, high-speed data signals are transmitted between the electronic package 1106 and the cable connector modules 1104 via the interposer assemblies 1108 without the high-speed data signals passing through the host circuit board 1110. In an exemplary embodiment, a plurality of cable connector modules 1104 are coupled to the electronic package 1106. For example, the cable connector modules 1104 may be provided on multiple sides of the integrated circuit or other communication element of the electronic package 1106. In the illustrated embodiment, the cable connector modules 1104 are provided on all four sides of the integrated circuit. Other arrangements are possible in alternative embodiments.

In an exemplary embodiment, the compression hardware 1116 includes spring members configured to transfer spring forces from the compression hardware 1116 to the load plate 1120. Other types of compression members may be used in alternative embodiments. In the illustrated embodiment, the compression hardware 1116 is provided on all four sides of the load plate 1120; however, the compression hardware 1116 may be coupled to other areas of the load plate 1120 in alternative embodiments.

Figure 18:
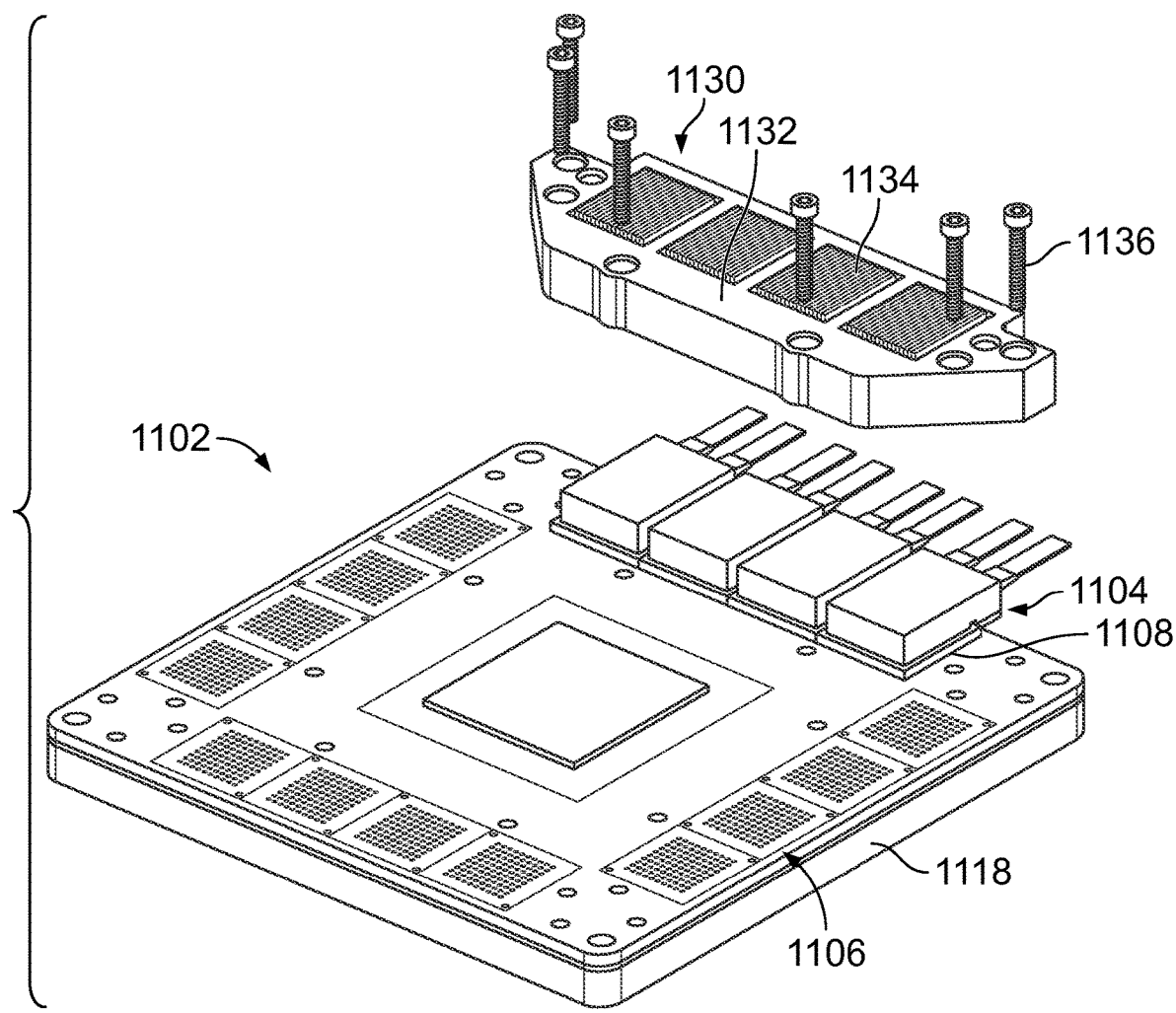
FIG. 18 is a perspective view of a portion of the electronic assembly in accordance with an exemplary embodiment showing one of the cover assemblies poised for mating with the electronic package over the cable connector modules.

In an exemplary embodiment, the electronic assembly 1102 includes one or more cover assembly 1130 coupled to the electronic package 1106. The cover assembly 1130 covers the cable connector modules 1104 and the interposer assemblies 1108. In the illustrated embodiment, the electronic assembly 1102 includes multiple cover assemblies 1130, such as at each side of the integrated circuit of the electronic package 1106. Each cover assembly 1130 covers multiple cable connector modules 1104. The cover assembly 1130 includes a cover 1132 and bridge assemblies 1134 coupled to the cover 1132. The cover 1132 is coupled to the bolster plate 1118 using fasteners 1136 (FIG. 18). The bridge assemblies 1134 are aligned with the cable connector modules 1104. The bridge assemblies 1134 are used to transfer compression loads from the load plate 1120 to the interposer assemblies 1108. The compression loads may come from the compression hardware 1116. The compression loads may additionally or alternatively come from internal spring elements, such as spring elements within the bridge assemblies 1134. The load plate 1120 presses against the bridge assemblies 1134 and drives the bridge assemblies 1134 into the cable connector modules 1104. The forces from the load plate 1120 compress the interposer assemblies 1108 against the integrated circuit or the substrate of the electronic package 1106. The bridge assemblies 1134 press the cable connector modules 1104 into the interposer assemblies 1108. The compressive forces from the load plate 1120 may be transferred to the interposer contacts through the compressive forces applied to the individual cable connector modules 1104.

In an exemplary embodiment, the load plate 1120 may be thermally coupled to the cable connector modules 1104 through the bridge assemblies 1134. For example, the bridge assemblies 1134 define heat spreaders for dissipating heat from the cable connector modules 1104 to the heat transfer element 1122 defined by the load plate 1120.

In an exemplary embodiment, the interposer assemblies 1108 define separable mating interfaces. For example, each interposer assembly 1108 includes an upper separable mating interface, such as a compressible interface. As such, the cable connector modules 1104 may be removable or replaceable. Each interposer assembly 1108 may include a lower separable mating interface, such as a compressible interface.

The contacts of the interposer assembly 1108 may be compressible columnar contacts, such as conductive elastomeric contacts. In other embodiments, the contacts of the interposer assembly 1108 may be stamped and formed contacts, such as including spring beams. The spring beams may be provided at the top and/or the bottom of the interposer assembly 1108. The contacts may be press fit contacts, solder contacts, or other types of contacts in alternative embodiments. In various embodiments, a plurality of interposer assemblies 1108 are mounted to the electronic package 1106. For example, each cable connector module 1104 is mounted to a separate interposer assembly 1108. In alternative embodiments, a plurality of cable connector modules 1104 may be mounted to a single interposer assembly 1108. For example, separate interposer assemblies 1108 may be provided along each side of the electronic package 1106. In another embodiment, a single interposer assembly is provided extending along all four sides of the electronic package 1106.

Figure 3:
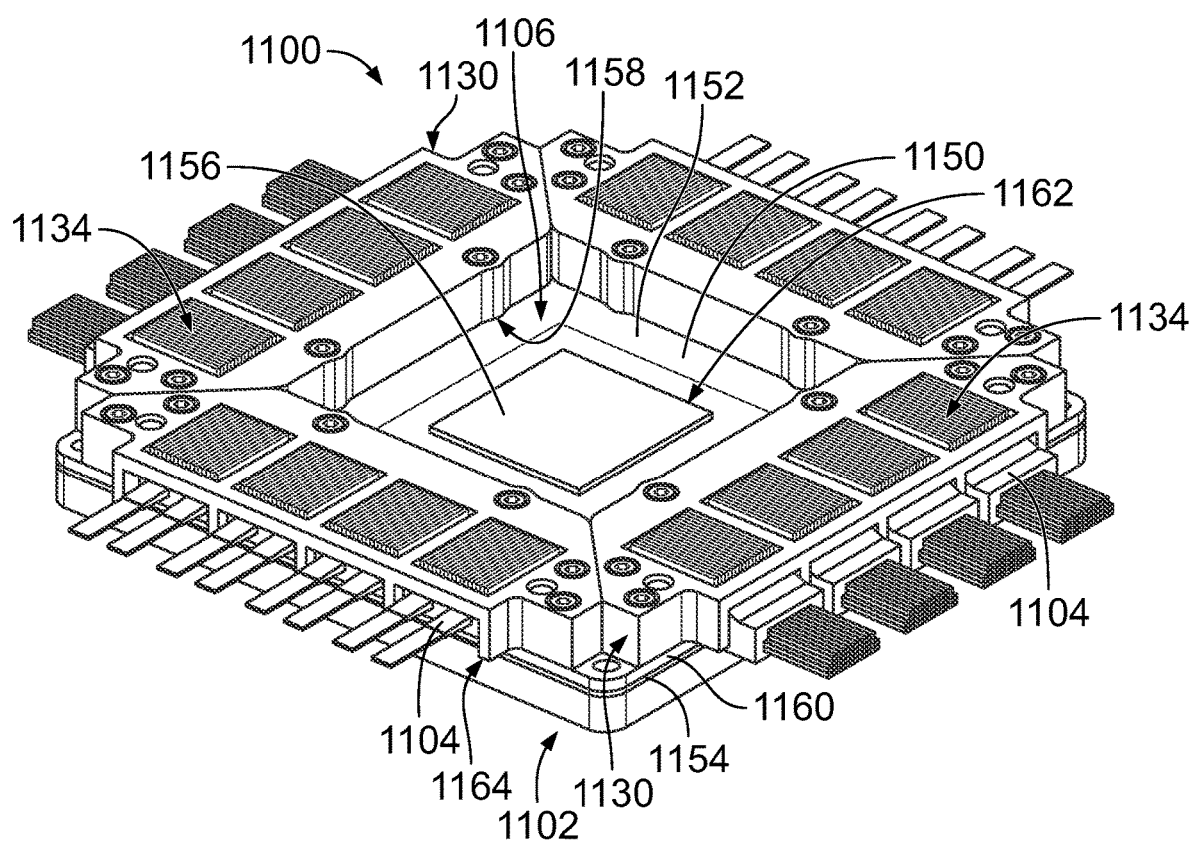
FIG. 3 is a perspective view of the electronic assembly in accordance with an exemplary embodiment.

FIG. 3 is a perspective view of the electronic assembly 1102 in accordance with an exemplary embodiment. The electronic assembly 1102 includes the electronic package 1106 supporting a plurality of the cable connector modules 1104. The interposer assemblies 1108 electrically connect the cable connector modules 1104 to the electronic package 1106. The cover assembly 1130 is used to couple the cable connector modules 1104 to the electronic package 1106. When the load plate 1120 (shown in FIG. 1) is coupled to the cover assembly 1130, the bridge assemblies 1134 are used to compress the interposer assemblies 1108 between the cable connector modules 1104 and the electronic package 1106.

The electronic package 1106 includes a package substrate 1150 having an upper surface 1152 and a lower surface 1154. The electronic package 1106 includes an integrated circuit component 1156 mounted to the upper surface 1152 of the package substrate 1150. The integrated circuit component 1156 may be a chip, an ASIC, a processor, a memory module or another component mounted to the top of the package substrate 1150. In the illustrated embodiment, the integrated circuit component 1156 is rectangular and approximately centered on the package substrate 1150; however, the integrated circuit component 1156 may have other shapes or locations or there may be more than one integrated circuit component in alternative embodiments. In an exemplary embodiment, the package substrate 1150 includes locating features 1158 for locating the electronic package 1106 relative to the host circuit board 1110 (shown in FIG. 1). In the illustrated embodiment, the locating features 1158 are openings through the package substrate 1150. Other types of locating features may be used in alternative embodiments, such as channels, dimples, extensions, tabs, posts, pins, and the like.

The package substrate 1150 includes edges 1160 extending around the perimeter of the package substrate 1150. In the illustrated embodiment, the package substrate 1150 is rectangular shape having four perpendicular edges. The package substrate 1150 may have other shapes including greater or fewer edges 1160 in alternative embodiments. The integrated circuit component 1156 is mounted to the package substrate 1150 at a component mounting area 1162, which may be approximately centered between the edges 1160. The package substrate 1150 includes package contacts (not shown) at the component mounting area 1162 used to electrically connect the integrated circuit component 1156 to the package substrate 1150. The package contacts may be pads, traces, vias, and the like.

The package substrate 1150 includes lower package contacts (not shown) at the lower surface 1154 of the package substrate 1150. The lower package contacts are used to electrically connect the electronic package 1106 to the board connector 1112 (shown in FIG. 2). In an exemplary embodiment, power and low-speed data signals are transmitted through the lower package contacts between the package substrate 1150 and the board connector 1112. High speed data signals may additionally be transmitted through the lower package contacts. The lower package contacts are electrically connected to the integrated circuit component 1156 via corresponding package contacts. In an exemplary embodiment, the lower package contacts may be approximately centered along the lower surface 1154, such as directly below the component mounting area 1162.

The package substrate 1150 includes upper package contacts (not shown) at the upper surface 1152 of the package substrate 1150. The upper package contacts are used to electrically connect the electronic package 1106 to the cable connector modules 1104 via the interposer assemblies 1108. In an exemplary embodiment, high-speed data signals are transmitted through the upper package contacts between the package substrate 1150 and the cable connector modules 1104. The upper package contacts are electrically connected to the integrated circuit component 1156 via corresponding package contacts. In an exemplary embodiment, the upper package contacts are provided around the outer periphery of the package substrate 1150. In an exemplary embodiment, the package substrate 1150 includes mounting areas 1164 around the outer periphery of the package substrate 1150. The interposer assemblies 1108 and the cable connector modules 1104 are coupled to the package substrate 1150 at the mounting areas 1164. The mounting areas 1164 are located between the integrated circuit component 1156 at the component mounting area 1162 and the edges 1160. In the illustrated embodiment, the mounting areas 1164 are provided along all four sides of the integrated circuit component 1156 for the purpose of achieving short electrical traces (improved signal integrity) to/from the integrated circuit component 1156.

The electronic assembly 1102 has high channel density for data communication and power distribution to the integrated circuit component 1156. For example, data channels are provided on both the upper surface 1152 and the lower surface 1154 of the package substrate 1150. A subset of the data signals, such as the low speed and/or sideband data signals, are routed through the bottom of the electronic package 1106 to the host circuit board 1110 and a subset of the data signals, such as the high speed data signals, are routed through the top of the electronic package 1106 to the cable connector modules 1104. The performance and design efficiency are enhanced by increasing the number of data channels to the integrated circuit component 1156. Furthermore, by routing the high-speed data signals directly to the cable connector modules 1104, rather than routing the high-speed data signals through the host circuit board 1110, the performance of the communication system 1100 is enhanced. In an exemplary embodiment, the cable connector modules 1104 are coupled to the electronic package 1106 at multiple locations (e.g., at four sides of the chip) to increase density of the communication system 1100 and shorten electrical paths of the communication system 1100. The arrangement reduces the number of interfaces needed along the bottom of the package substrate 1150 by routing the data channels to the top of the package substrate 1150 for take-off by the cable connector modules 1104. The cable connector modules 1104 are separable from the electronic package 1106 using the interposer assemblies 1108. Each cable connector module 1104 has its own compressive mating force using the corresponding bridge assemblies 1134. The cover assembly 1130 can be removed to service an individual cable connector module 1104, such as to adjust or replace the cable connector module 1104.

Figure 4:
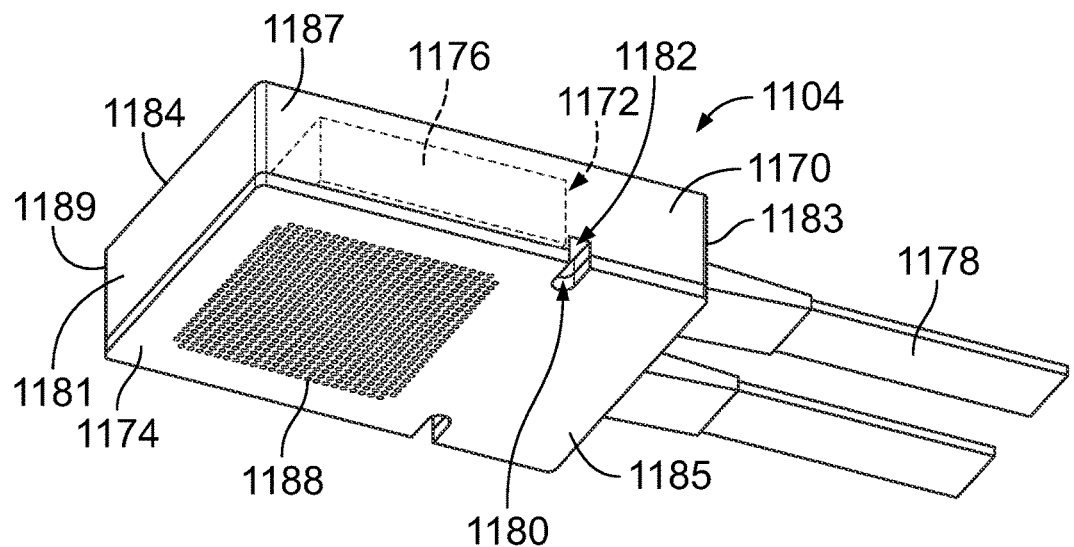
FIG. 4 is a perspective view of the cable connector module in accordance with an exemplary embodiment.
Figure 5:
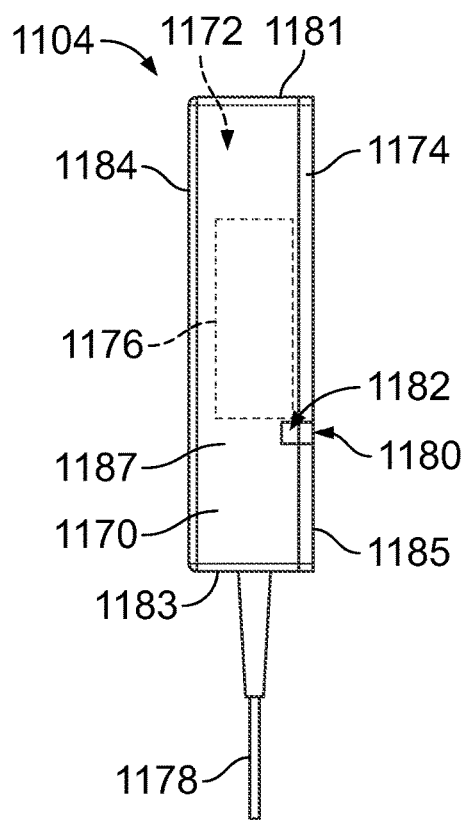
FIG. 5 is a side view of the cable connector module in accordance with an exemplary embodiment.
Figure 6:
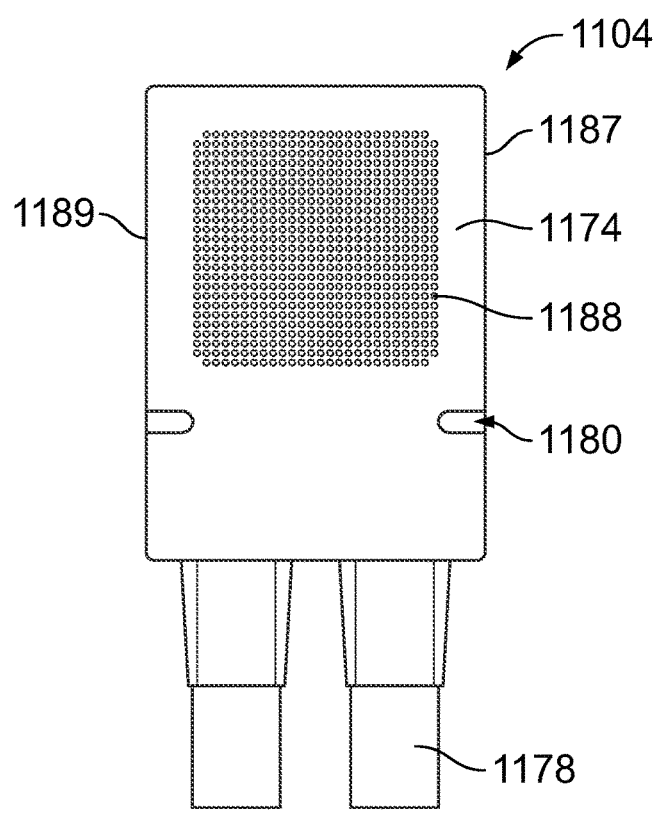
FIG. 6 is a bottom view of the cable connector module in accordance with an exemplary embodiment.

FIG. 4 is a perspective view of the cable connector module 1104 in accordance with an exemplary embodiment. FIG. 5 is a side view of the cable connector module 1104 in accordance with an exemplary embodiment. FIG. 6 is a bottom view of the cable connector module 1104 in accordance with an exemplary embodiment. In the illustrated embodiment, the cable connector module 1104 may be an optical module, such as including fiber optic data transmission. Alternatively, the cable connector module 1104 may be a copper cable module using a copper conductor cable to transmit electrical data signals.

The cable connector module 1104 includes a connector module housing 1170 having a cavity 1172 that receives a connector module substrate 1174. One or more cables 1178 extend from the connector module housing 1170. In various embodiments, the cable connector module 1104 may be an optical module having an optical engine 1176 (shown in phantom) for optical-digital conversion. In an exemplary embodiment, the optical engine 1176 includes an electrical-to-optical converter configured to convert between electrical signals and optical signals. The optical engine 1176 may include other electrical components. The cables 1178 may be terminated to the optical engine 1176. Alternatively, the cable connector module 1104 is an electrical module having signal conductors. For example, the cables 1178 may be copper cables terminated directly to the connector module substrate 1174, such as being soldered to pads of the connector module substrate 1174. The cables 1178 may be connected to the substrate 1174 or other component at separable interfaces. For example, the cables may be plugged into the connector module housing 1170.

The connector module substrate 1174 extends between a front 1181 and a rear 1183 of the cable connector module 1104. The connector module substrate 1174 is provided at a bottom 1185 of the cable connector module 1104. The connector module substrate 1174 extends between sides 1187, 1189 of the cable connector module 1104. The connector module substrate 1174 may be a printed circuit board or other suitable material for routing electrical traces. The connector module substrate 1174 includes module contacts 1188 configured to be electrically connected to the interposer assembly 1108 (shown in FIG. 3). For example, the module contacts may be pads on the bottom of the connector module substrate 1174.

In an exemplary embodiment, the connector module substrate 1174 includes locating features 1180 configured to locate the cable connector module 1104 relative to the interposer assembly 1108. In an exemplary embodiment, the connector module housing 1170 includes locating features 1182 configured to locate the cable connector module 1104 relative to the interposer assembly 1108. The locating features 1180, 1182 are defined by slots, which are aligned with each other and configured to receive a locating feature of the interposer assembly 1108 to align the cable connector module 1104 with the interposer assembly 1108. Other types of locating features 1180, 1182 may be provided in alternative embodiments, such as protrusions or pins.

In an exemplary embodiment, the connector module housing 1170 is manufactured from a thermally conductive material, such as a metal material. The connector module housing 1170 may transfer heat from heat generating components, such as the optical engine 1176 or the cables 1178 or other components. In an exemplary embodiment, the bridge assembly 1134 (shown in FIG. 2) is configured to engage a top 1184 of the connector module housing 1170 to dissipate heat from the cable connector module 1104.

Figure 7:
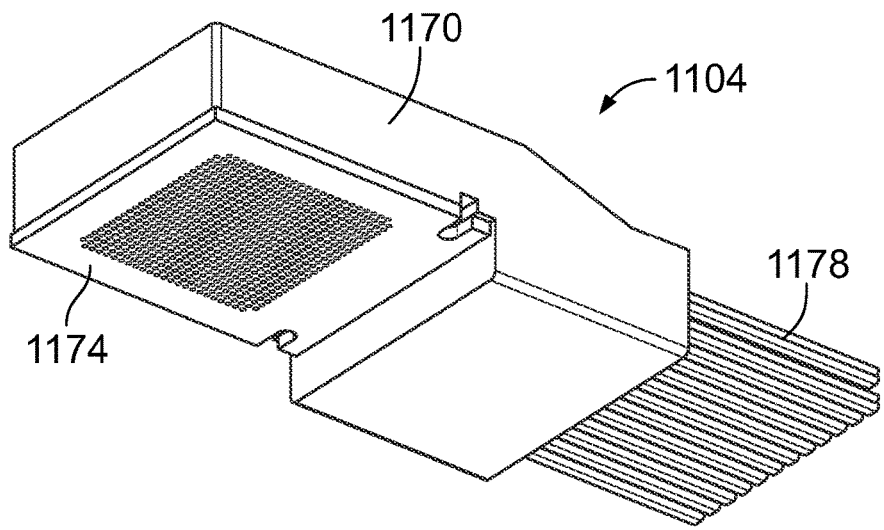
FIG. 7 is a perspective view of the cable connector module in accordance with an exemplary embodiment.
Figure 8:
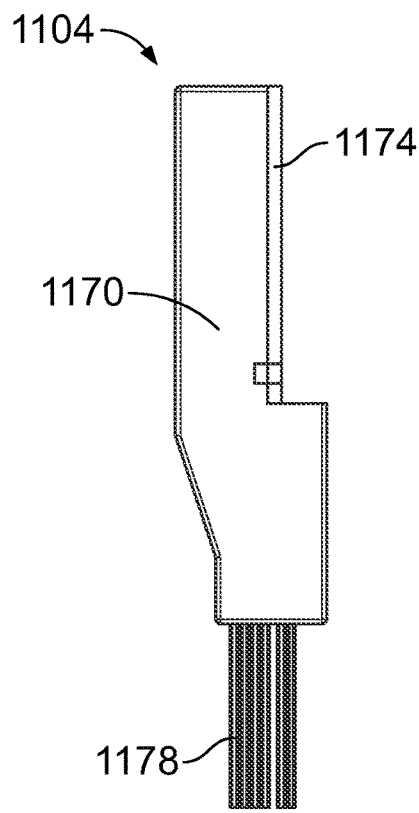
FIG. 8 is a side view of the cable connector module in accordance with an exemplary embodiment.
Figure 9:
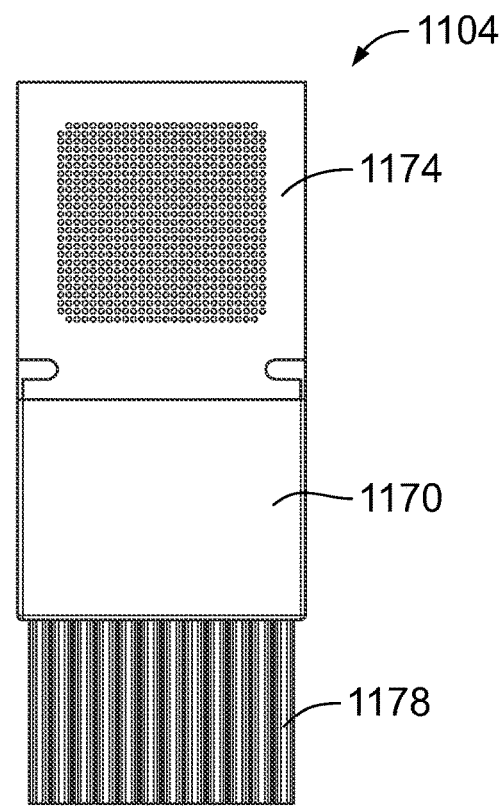
FIG. 9 is a bottom view of the cable connector module in accordance with an exemplary embodiment.

FIG. 7 is a perspective view of the cable connector module 1104 in accordance with an exemplary embodiment. FIG. 8 is a side view of the cable connector module 1104 in accordance with an exemplary embodiment. FIG. 9 is a bottom view of the cable connector module 1104 in accordance with an exemplary embodiment. In the illustrated embodiment, the cable connector module 1104 is a copper cable module rather than an optic module. The cables 1178 are copper cables, such as coaxial cables, twin-axial cables. The cables 1178 extend into the connector module housing 1170 for termination to the connector module substrate 1174. The connector module housing 1170 may be shaped differently, such as to accommodate the copper cables, which may be terminated to both the upper and lower surfaces of the connector module substrate 1174.

Figure 10:
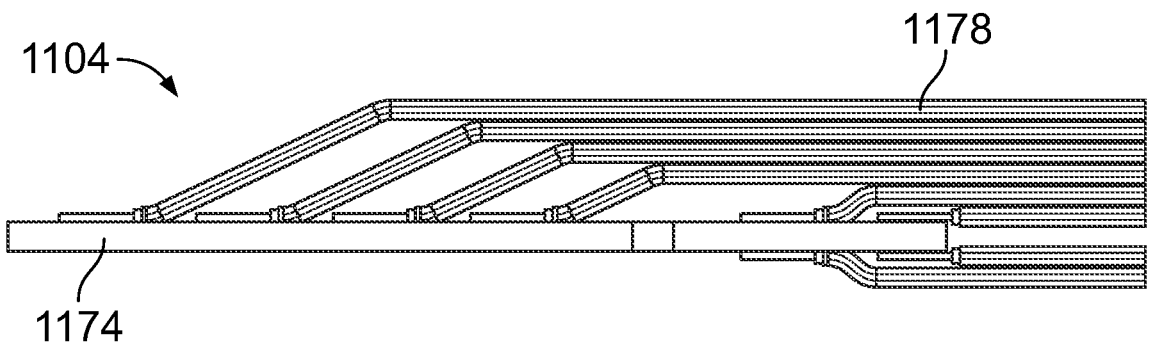
FIG. 10 is a side view of a portion of the cable connector module in accordance with an exemplary embodiment showing the cables terminated to the connector module substrate.
Figure 11:
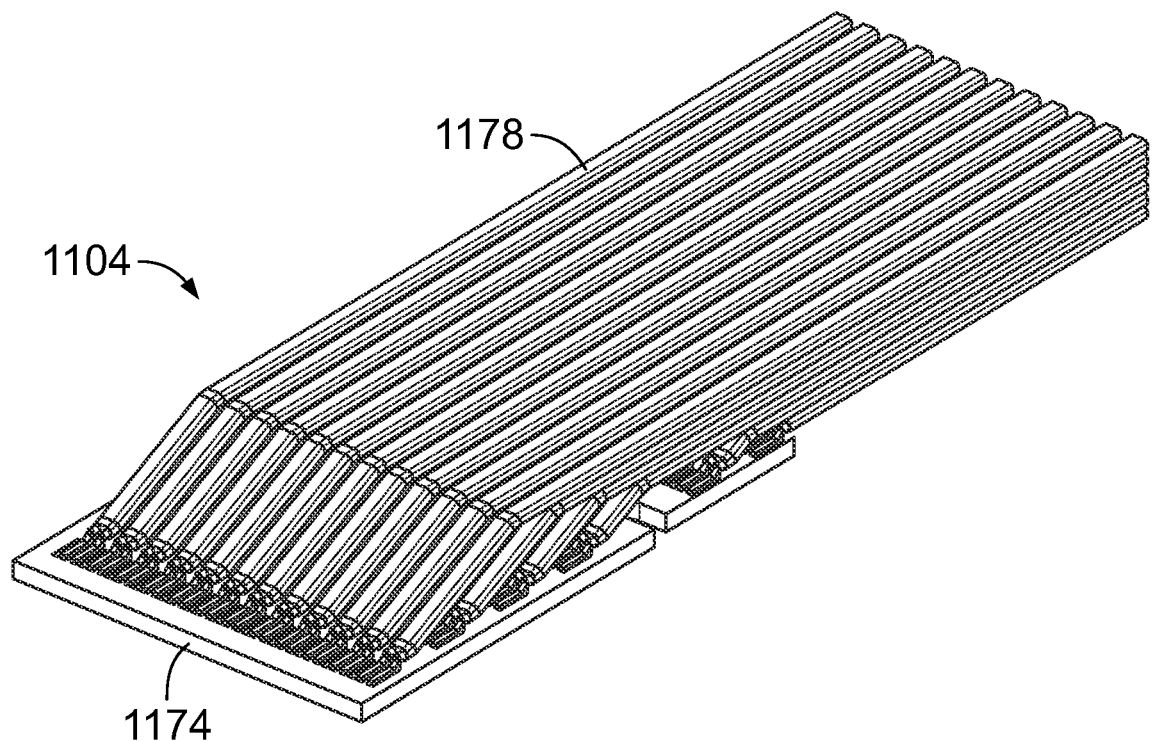
FIG. 11 is a perspective view of a portion of the cable connector module in accordance with an exemplary embodiment showing the cables terminated to the connector module substrate.

FIG. 10 is a side view of a portion of the cable connector module 1104 in accordance with an exemplary embodiment showing the cables 1178 terminated to the connector module substrate 1174. FIG. 11 is a perspective view of a portion of the cable connector module 1104 in accordance with an exemplary embodiment showing the cables 1178 terminated to the connector module substrate 1174. In an exemplary embodiment, conductors of the cables 1178 are soldered directly to the connector module substrate 1174, such as to the upper surface and the lower surface of the connector module substrate 1174.

Figure 12:
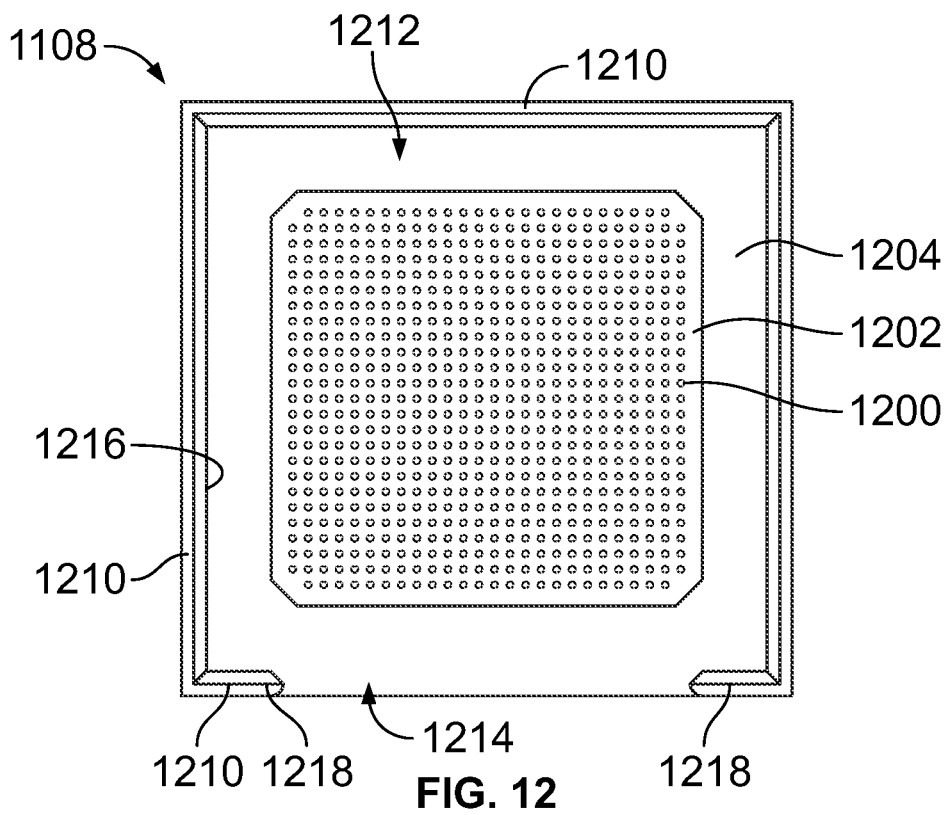
FIG. 12 is a top view of the interposer assembly in accordance with an exemplary embodiment.
Figure 13:
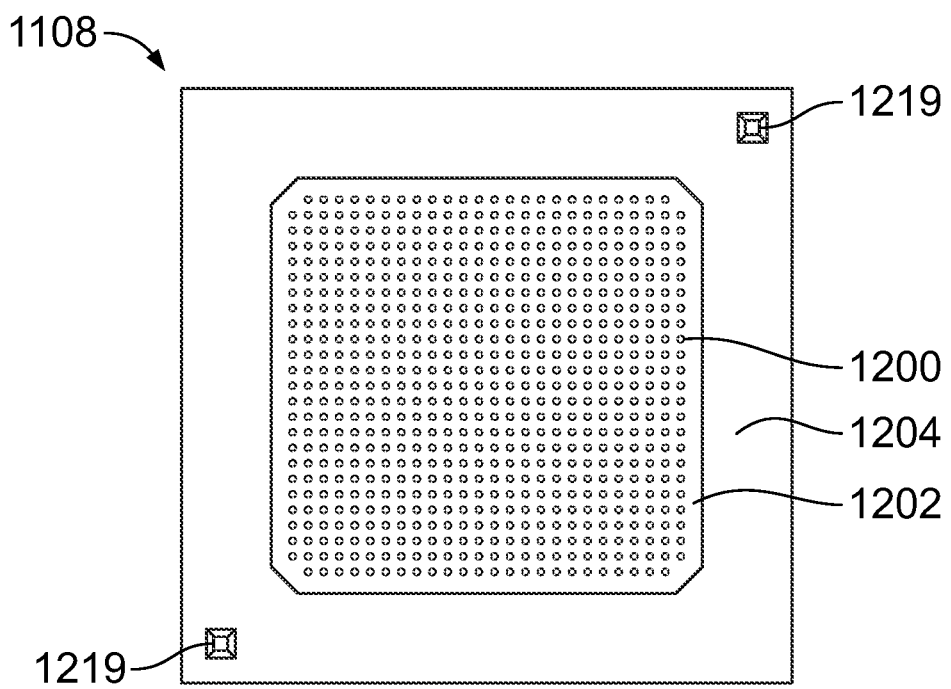
FIG. 13 is a bottom view of the interposer assembly in accordance with an exemplary embodiment.
Figure 14:
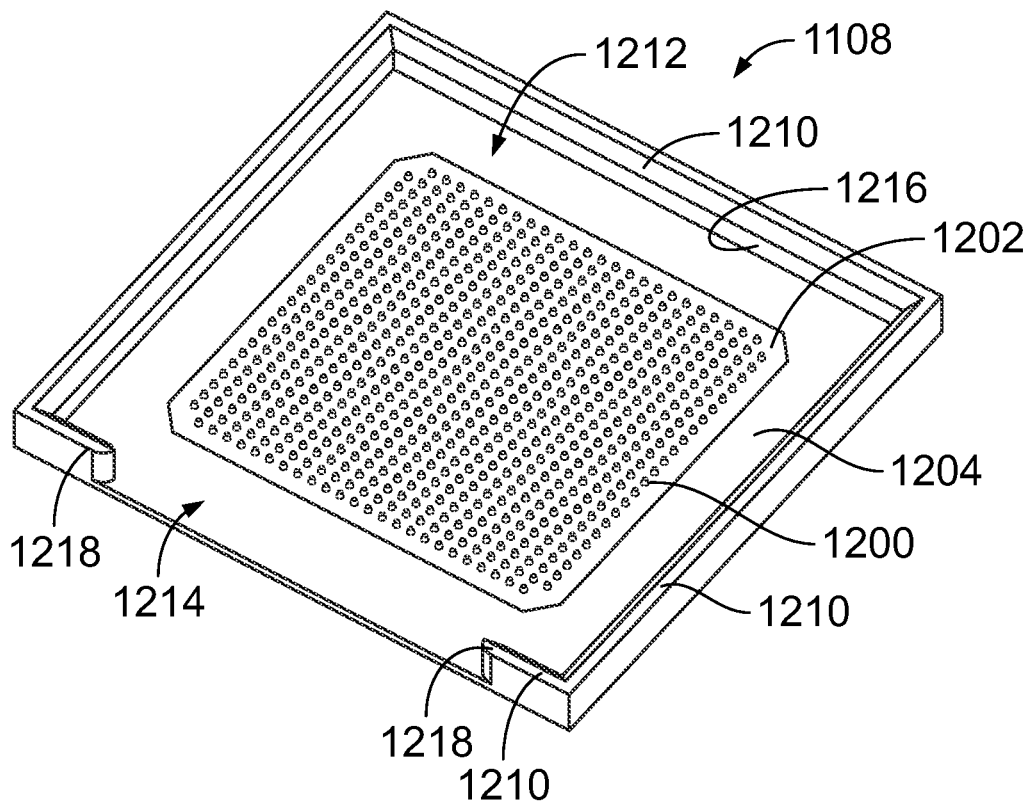
FIG. 14 is a perspective view of the interposer assembly in accordance with an exemplary embodiment.

FIG. 12 is a top view of the interposer assembly 1108 in accordance with an exemplary embodiment. FIG. 13 is a bottom view of the interposer assembly 1108 in accordance with an exemplary embodiment. FIG. 14 is a perspective view of the interposer assembly 1108 in accordance with an exemplary embodiment. The interposer assembly 1108 includes an array of interposer contacts 1200 held together by a support plate 1202. The interposer assembly 1108 includes an interposer frame 1204 holding the support plate 1202 and the interposer contacts 1200. The interposer frame 1204 may be a multipiece frame, such as having an upper frame member and a lower frame member with the support plate 1202 sandwiched between the upper and lower frame members. The interposer frame 1204 extends around an outer periphery of the interposer assembly 1108, such as along all four sides of the support plate 1202. The interposer frame 1204 may have other shapes in alternative embodiments.

In an exemplary embodiment, the interposer frame 1204 includes upper locating walls 1210 forming a socket 1212 configured to receive the corresponding cable connector module 1104. The upper locating walls 1210 may form a rectangular socket 1212; however, the socket 1212 may have other shapes in alternative embodiments. In an exemplary embodiment, an opening 1214 is provided in one of the upper locating walls 1210. The opening 1214 is configured to receive a portion of the cable connector module 1104. In an exemplary embodiment, interior surfaces of the upper locating walls 1210 form locating surfaces 1216 for locating the cable connector module 1104 in the socket 1212. In an exemplary embodiment, the interposer frame 1204 includes locating features 1218 for locating the cable connector module 1104. For example, edges of the upper locating walls 1210 facing the opening 1214 form the locating features 1218. The locating features 1218 are configured to be received in the locating features 1180, 1182 (for example, slots) of the cable connector module 1104.

In an exemplary embodiment, the interposer frame 1204 includes lower locating pins 1219 (FIG. 13) extending downward from the lower frame member 1208. The lower locating pins 1219 are used for locating the interposer assembly 1108 relative to the electronic package 1106 (shown in FIG. 3). The lower locating pins 1219 are received in the package substrate 1150 (shown in FIG. 3) to position the interposer frame 1204 and the interposer contacts 1200 relative to the package substrate 1150. Other types of locating features may be used in alternative embodiments.

Figure 15:
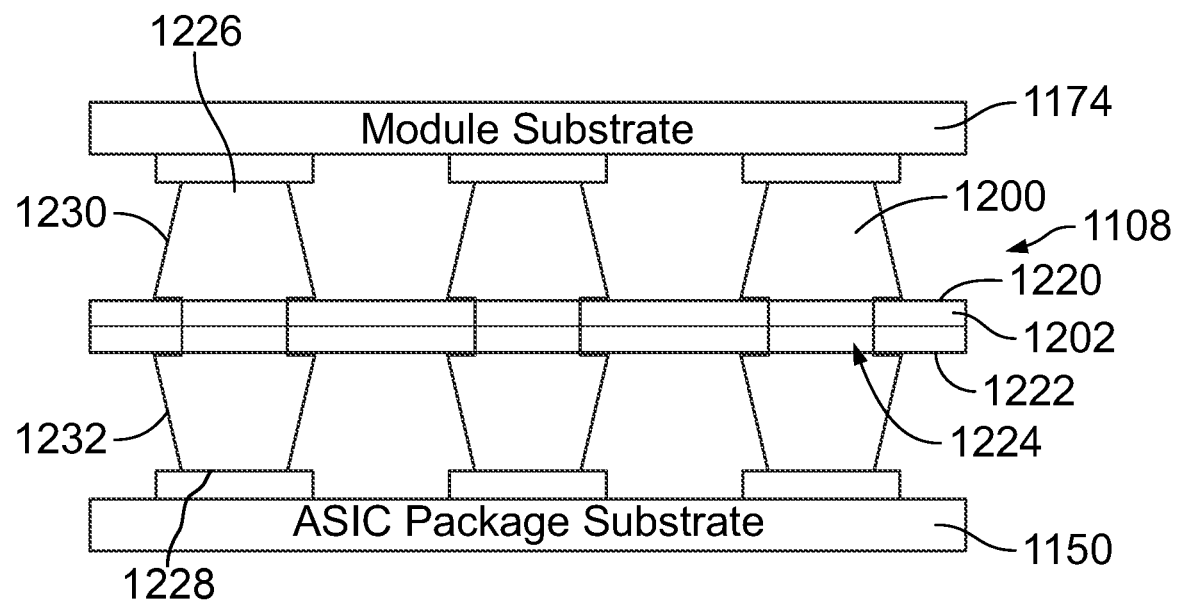
FIG. 15 is a side view of a portion of the interposer assembly showing the support plate and a plurality of the interposer contacts located between the package substrate and the connector module substrate in accordance with an exemplary embodiment.

FIG. 15 is a side view of a portion of the interposer assembly 1108 showing the support plate 1202 and a plurality of the interposer contacts 1200 located between the package substrate 1150 and the connector module substrate 1174. In an exemplary embodiment, the support plate 1202 is a film having an upper surface 1220 and a lower surface 1222. The support plate 1202 includes openings 1214 therethrough holding corresponding interposer contacts 1200. The support plate 1202 is manufactured from an insulative material, such as a polyimide material, to electrically isolate the interposer contacts 1200 from one another.

The interposer contacts 1200 are held by the support plate 1202. In an exemplary embodiment, the interposer contacts 1200 are compressible contacts, such as conductive polymer columns. Each interposer contact 1200 includes an upper mating interface 1226 and a lower mating interface 1228. The upper mating interface 1226 is located above the upper surface 1220 of the support plate 1202 and the lower mating interface 1228 is located below the lower surface 1222 of the support plate 1202. The interposer contacts 1200 are compressible between the upper mating interfaces 1226 and the lower mating interfaces 1228. Optionally, the upper and lower mating interfaces 1226, 1228 may be planar interfaces oriented parallel to each other. Optionally, upper and lower sides 1230, 1232 of the interposer contacts 1200 may be tapered. For example, the sides 1230, 1232 may be oriented non-perpendicular to the upper and lower mating interfaces 1226, 1228. The upper and lower portions of the interposer contacts 1200 may be cone-shaped, such as being frustoconical. Other types of interposer contacts 1200 may be utilized in alternative embodiments.

Figure 16:
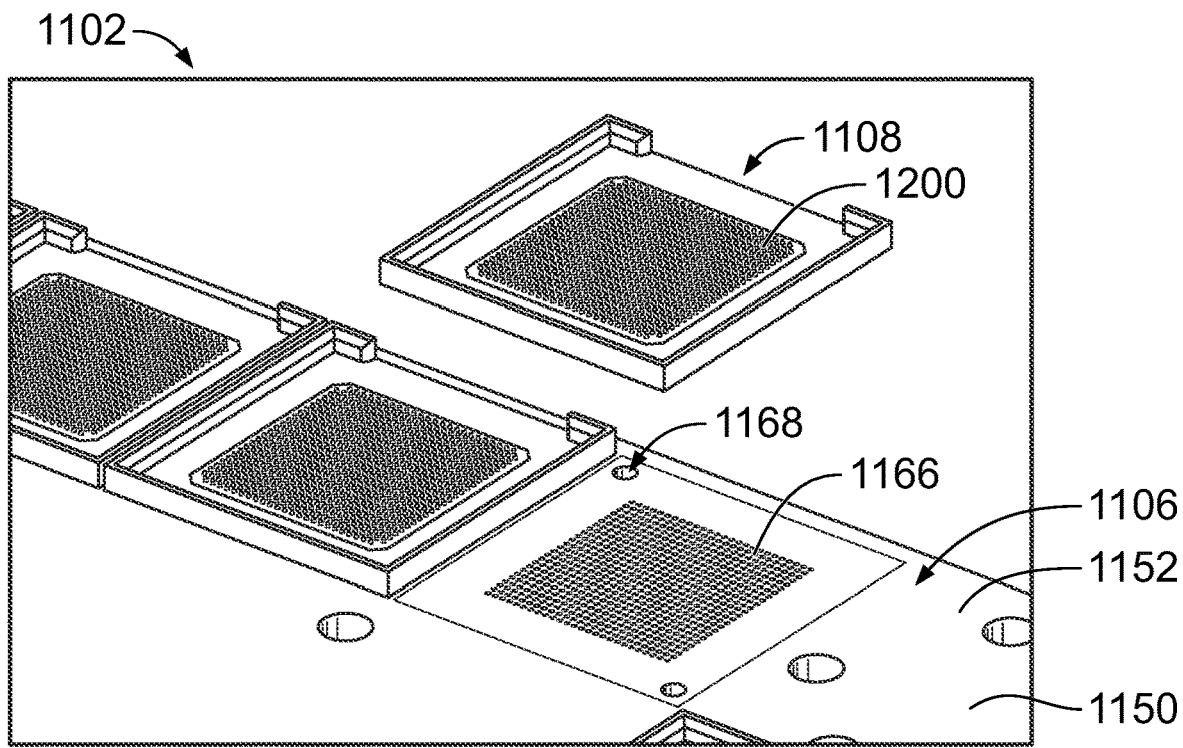
FIG. 16 is a perspective view of a portion of the electronic assembly in accordance with an exemplary embodiment showing one of the interposer assemblies poised for mating with the electronic package.

FIG. 16 is a perspective view of a portion of the electronic assembly 1102 in accordance with an exemplary embodiment showing one of the interposer assemblies 1108 poised for mating with the electronic package 1106. The package substrate 1150 includes a plurality of upper package contacts 1166 on the upper surface 1152 of the package substrate 1150. The upper package contacts 1166 are arranged in an array complementary to the array of interposer contacts 1200. The upper package contacts 1166 may be signal contacts and/or ground contacts and/or power contacts.

The package substrate 1150 includes interposer locating features 1168 for locating the interposer assembly 1108 relative to the electronic package 1106. In the illustrated embodiment, the interposer locating features 1168 are openings in the package substrate 1150 configured to receive the lower locating pins 1219 of the interposer assembly 1108. Other types of locating features may be used in alternative embodiments, such as protrusions, posts, and the like.

Figure 17:
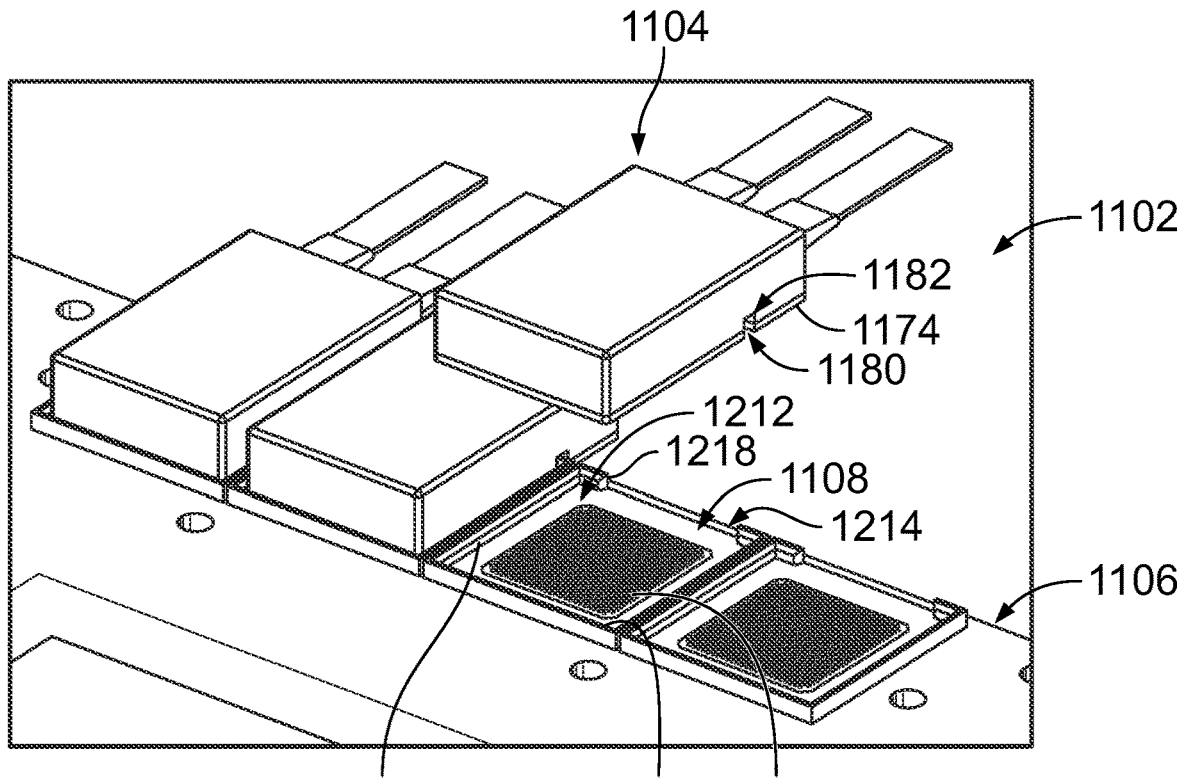
FIG. 17 is a perspective view of a portion of the electronic assembly in accordance with an exemplary embodiment showing one of the cable connector modules poised for mating with the corresponding interposer assembly and the electronic package.

FIG. 17 is a perspective view of a portion of the electronic assembly 1102 in accordance with an exemplary embodiment showing one of the cable connector modules 1104 poised for mating with the corresponding interposer assembly 1108 and the electronic package 1106. The cable connector module 1104 is configured to be received in the socket 1212 and engage the locating surfaces 1216 of the upper walls 1210. The locating features 1180, 1182 of the cable connector module 1104 are aligned with the locating features 1218 to locate the cable connector module 1104 relative to the interposer assembly 1108. The opening 1214 receives a portion of the cable connector module 1104. The connector module substrate 1174 is configured to be coupled to the interposer contacts 1200 of the interposer assembly 1108. For example, the connector module contacts on the bottom surface of the connector module substrate 1174 are aligned with and coupled to corresponding interposer contacts 1200. The connector module substrate 1174 electrically connects the interposer contacts 1200 with the cables 1178, such as directly or through the optical engine 1176.

FIG. 18 is a perspective view of a portion of the electronic assembly 1102 in accordance with an exemplary embodiment showing one of the cover assemblies 1130 poised for mating with the electronic package 1106 over the cable connector modules 1104. During assembly, the cover assembly 1130 is placed over the cable connector modules 1104 and the interposer assemblies 1108. The cover assembly 1130 covers multiple cable connector modules 1104. The cover 1132 holds the bridge assemblies 1134 and aligns the bridge assemblies 1134 with the cable connector modules 1104. The cover 1132 is coupled to the bolster plate 1118 using the fasteners 1136. When the cover assembly 1130 is coupled to the bolster plate 1118, the bridge assemblies 1134 are used to press downward against the cable connector modules 1104, such as by the load plate 1120. The bridge assemblies 1134 transfer compression loads from the load plate 1120 to the interposer assemblies 1108 through the cable connector modules 1104.

Figure 19:
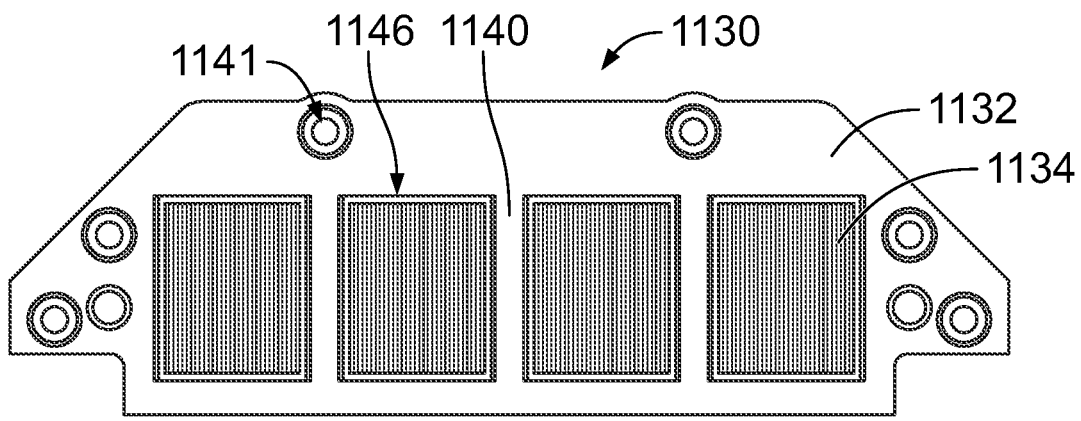
FIG. 19 is a top view of the cover assembly in accordance with an exemplary embodiment.
Figure 20:
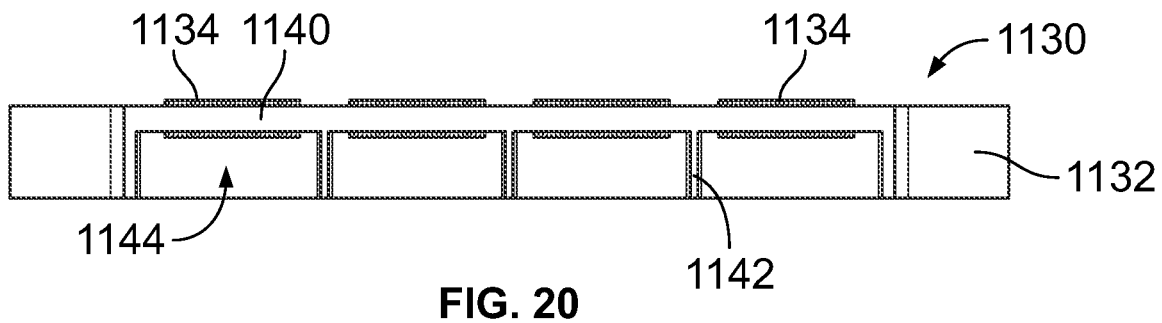
FIG. 20 is a side view of the cover assembly in accordance with an exemplary embodiment.
Figure 21:
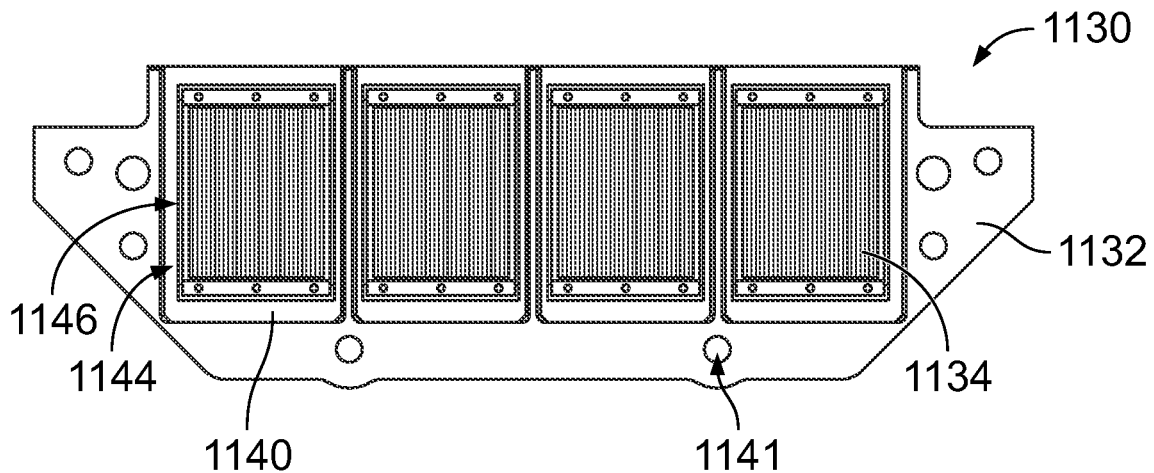
FIG. 21 is a bottom view of the cover assembly in accordance with an exemplary embodiment.
Figure 22:
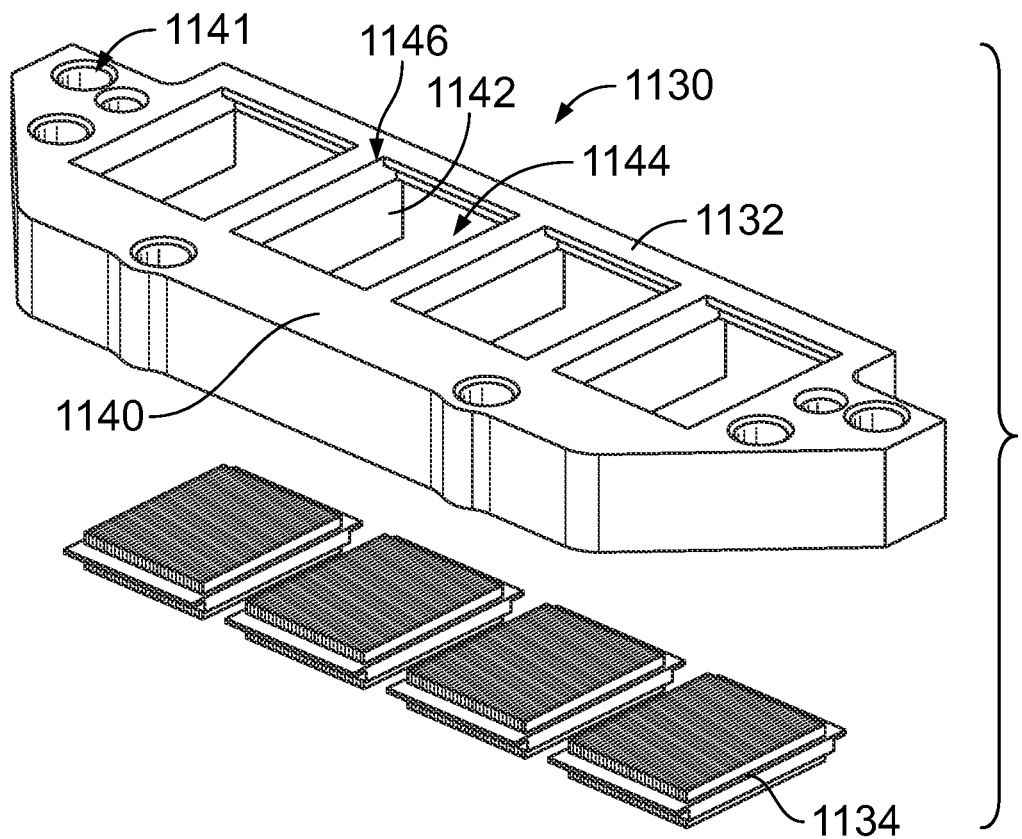
FIG. 22 is an exploded view of the cover assembly in accordance with an exemplary embodiment.

FIG. 19 is a top view of the cover assembly 1130 in accordance with an exemplary embodiment. FIG. 20 is a side view of the cover assembly 1130 in accordance with an exemplary embodiment. FIG. 21 is a bottom view of the cover assembly 1130 in accordance with an exemplary embodiment. FIG. 22 is an exploded view of the cover assembly 1130 in accordance with an exemplary embodiment. The cover assembly 1130 includes the cover 1132 and the bridge assemblies 1134.

The cover 1132 includes a plate 1140 at a top of the cover 1132. The plate 1140 includes openings 1141 for receiving the fasteners 1136 (shown in FIG. 18). The cover 1132 includes walls 1142 extending from the bottom of the plate 1140 to form one or more connector module cavities 1144. The walls 1142 may be separating walls 1142 between connector module cavities 1144. The connector module cavities 1144 are configured to receive corresponding cable connector modules 1104 (shown in FIG. 18). The separating walls 1142 separate the cable connector modules 1104. The separating walls 1142 may be used to guide mating of the cover 1132 with the cable connector modules 1104. The plate 1140 includes windows 1146 therethrough aligned with the connector module cavities 1144. The bridge assemblies 1134 are received in corresponding connector module cavities 1144 and extend through the windows 1146. Tops of the bridge assemblies 1134 may be located above the top of the plate 1140 to interface with the load plate 1120 (shown in FIG. 1). Bottoms of the bridge assemblies 1134 may be located below the plate 1140 in the connector module cavity 1144 to interface with the cable connector modules 1104. In an exemplary embodiment, the bridge assemblies 1134 are coupled to the cover 1132, such as being welded to the bottom of the plate 1140 or secured by other means, such as using fasteners. In alternative embodiments, the cover 1132 has a single connector module cavity 1144 and a single window 1146. Multiple covers 1132 may be arranged adjacent each other to form an array.

Figure 23:
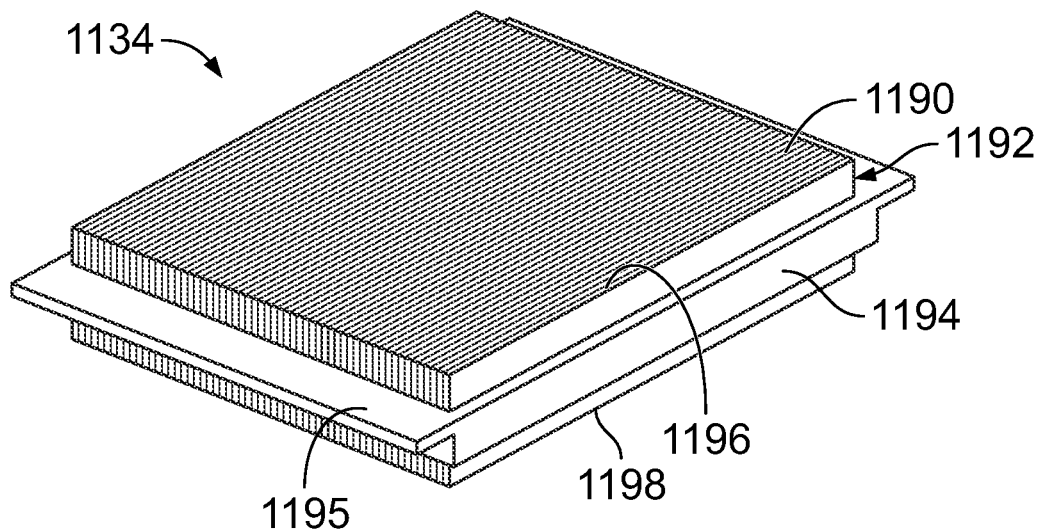
FIG. 23 is a perspective view of the bridge assembly in accordance with an exemplary embodiment.

FIG. 23 is a perspective view of the bridge assembly 1134 in accordance with an exemplary embodiment. The bridge assembly 1134 includes a plurality of plates 1190 arranged in a plate stack 1192. A frame 1194 holds the plates 1190 in the plate stack 1192. The plates 1190 may be coupled to the frame by internal spring elements (not shown), which allow the plates 1190 to move relative to the frame 1194 and/or relative to each other. For example, the frame 1194 extends circumferentially around the plate stack 1192. The frame 1194 includes mounting tabs 1195 for mounting the bridge assembly 1134 to the cover 1132 (shown in FIG. 22). The plates 1190 extend between upper edges 1196 and lower edges 1198. In an exemplary embodiment, the plates 1190 include upper plates and lower plates interleved with each other. For example, the upper plates have the upper edges 1196 and the lower plates have the lower edges 1198.

The plates 1190 may be movable independently relative to each other and relative to the frame 1194. For example, the upper plates and the lower plates are movable relative to each other with the internal spring elements biasing the upper and lower plates apart from each other, such as driving the upper plates into the load plate 1120 and the lower plates into the cable connector modules 1104. Alternatively, the plates 1190 may be grouped together and the groups of plates 1190 may be movable relative to other group(s). The plates 1190 independently transfer the pressing forces from the load plate 1120 (shown in FIG. 1) to the cable connector module 1104 (shown in FIG. 18). The plates 1190 may conform to irregular shapes of the load plate 1120 and/or the cable connector module 1104. The plates 1190 may be metal plates in various embodiments. In such embodiments, the plates 1190 may be thermally conductive, such as to transfer heat from the cable connector modules 1104 to the load plate 1120 (for example, the heat transfer element 1122). As such, the plates 1190 form a thermal bridge between the cable connector modules 1104 and the load plate 1120. Alternatively, the plates 1190 may be plastic, such as to reduce weight and/or cost of the bridge assembly 1134.

Figure 24:
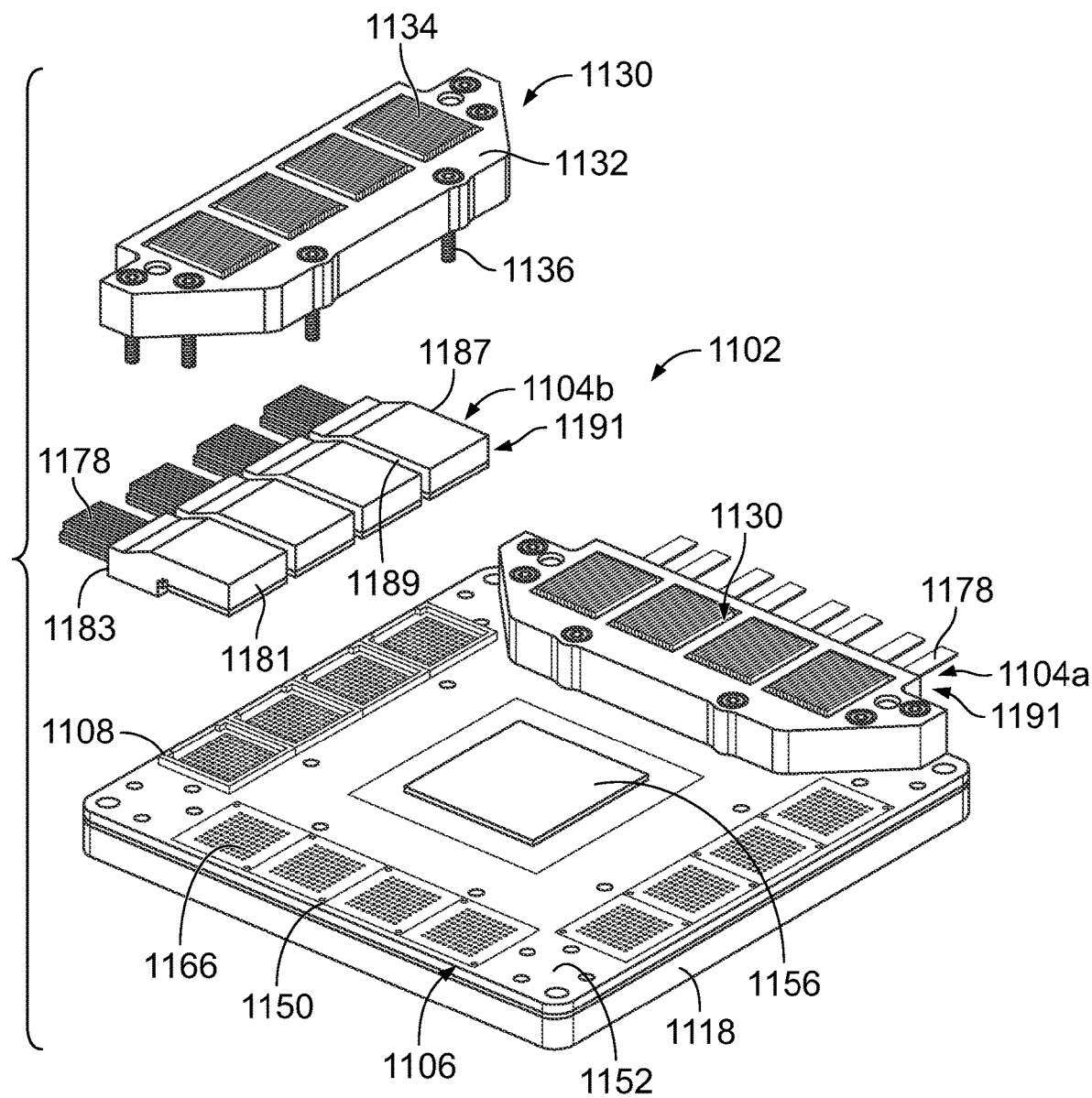
FIG. 24 is a perspective view of a portion of the electronic assembly in accordance with an exemplary embodiment showing one of the cover assemblies poised for mating with the electronic package over the cable connector modules.

FIG. 24 is a perspective view of a portion of the electronic assembly 1102 in accordance with an exemplary embodiment showing one of the cover assemblies 1130 poised for mating with the electronic package 1106 over the cable connector modules 1104. During assembly, the cover assembly 1130 is placed over the cable connector modules 1104 and the interposer assemblies 1108. The cover assembly 1130 covers multiple cable connector modules 1104. The cover 1132 holds the bridge assemblies 1134 and aligns the bridge assemblies 1134 with the cable connector modules 1104. The cover 1132 is coupled to the bolster plate 1118 using the fasteners 1136. When the cover assembly 1130 is coupled to the bolster plate 1118, the bridge assemblies 1134 are used to press downward against the cable connector modules 1104, such as by the load plate 1120. The bridge assemblies 1134 transfer compression loads from the load plate 1120 to the interposer assemblies 1108 through the cable connector modules 1104.

In an exemplary embodiment, the electronic assembly 1102 may include both fiber modules 1104a and copper cable modules 1104b. Both the fiber modules 1104a and copper cable modules 1104b are configured to be coupled to the interposer assemblies 1108. For example, the fiber modules 1104a and copper cable modules 1104b may have a common footprint and contact layout for mating to any of the interposer assemblies 1108. The interposer assemblies 1108 are designed for mating with both the fiber modules 1104a and copper cable modules 1104b.

The cable connector modules 1104 are arranged in cable connector module sets 1191. The cables 1178 of each cable connector module 1104 within the cable connector module set 1191 extend in a common direction (for example, from the same side of the electronic package 1106). The cable connector modules 1104 are mounted to the electronic package 1106 such that fronts 1181 and rears 1183 of the cable connector modules 1104 within each cable connector module set 1191 are aligned. The sides 1187, 1189 of the cable connector modules 1104 within the cable connector module set 1191 face each other and may abut against each other.

During assembly, the interposer assemblies 1108 are coupled to the package substrate 1150 at the upper package contacts 1166 around the integrated circuit component 1156 on the upper surface 1152 of the package substrate 1150. The cable connector modules 1104 are coupled to the corresponding interposer assemblies 1108. The cables 1178 extend from the sides of the electronic package 1106, and may extend from all four sides of the electronic package 1106. The cables 1178 extend generally horizontally from the electronic package 1106, thus limiting the height of the electronic assembly 1102. The cover assemblies 1130 are coupled to the cable connector modules 1104. The bridge assemblies 1134 are held in position by the cover 1132 and pressed downward against the cable connector modules 1104 by the compression assembly 1114.

Figure 25:
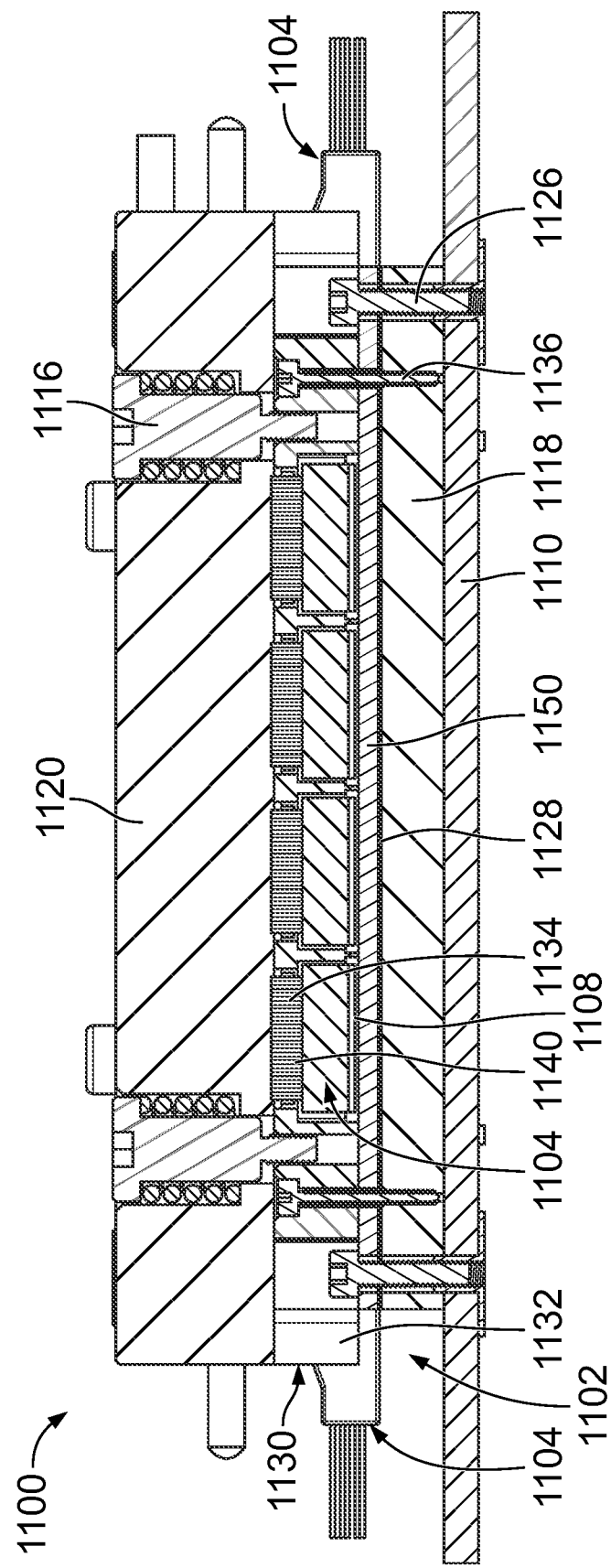
FIG. 25 is a cross-sectional view of a portion of the communication system showing the electronic assembly coupled to the host circuit board in accordance with an exemplary embodiment.

FIG. 25 is a cross-sectional view of a portion of the communication system 1100 showing the electronic assembly 1102 coupled to the host circuit board 1110. The bolster plate 1118 is mounted to the top of the host circuit board 1110. The package substrate 1150 is mounted above the bolster plate 1118, such as with the insulator 1128 between the package substrate 1150 and the bolster plate 1118. The package substrate 1150 and bolster plate 1118 may be secured to the host circuit board 1110 using fasteners 1126. The cover assembly 1130 is coupled to the package substrate 1150 and bolster plate 1118 over the cable connector modules 1104. The cover assembly 1130 is coupled to the package substrate 1150 and bolster plate 1118 using the fasteners 1136. The load plate 1120 is coupled to the cover 1132 using the compression hardware 1116. The compression hardware 1116 presses the load plate 1120 downward against the bridge assemblies 1134. The load plate 1120 forces the plates 1140 against the cable connector modules 1104 to compress the cable connector modules 1104 against the interposer assemblies 1108. The plates 1140 may be used to dissipate heat from the cable connector modules 1104 by forming thermal bridges between the cable connector modules 1104 and the load plate 1120.

Figure 26:
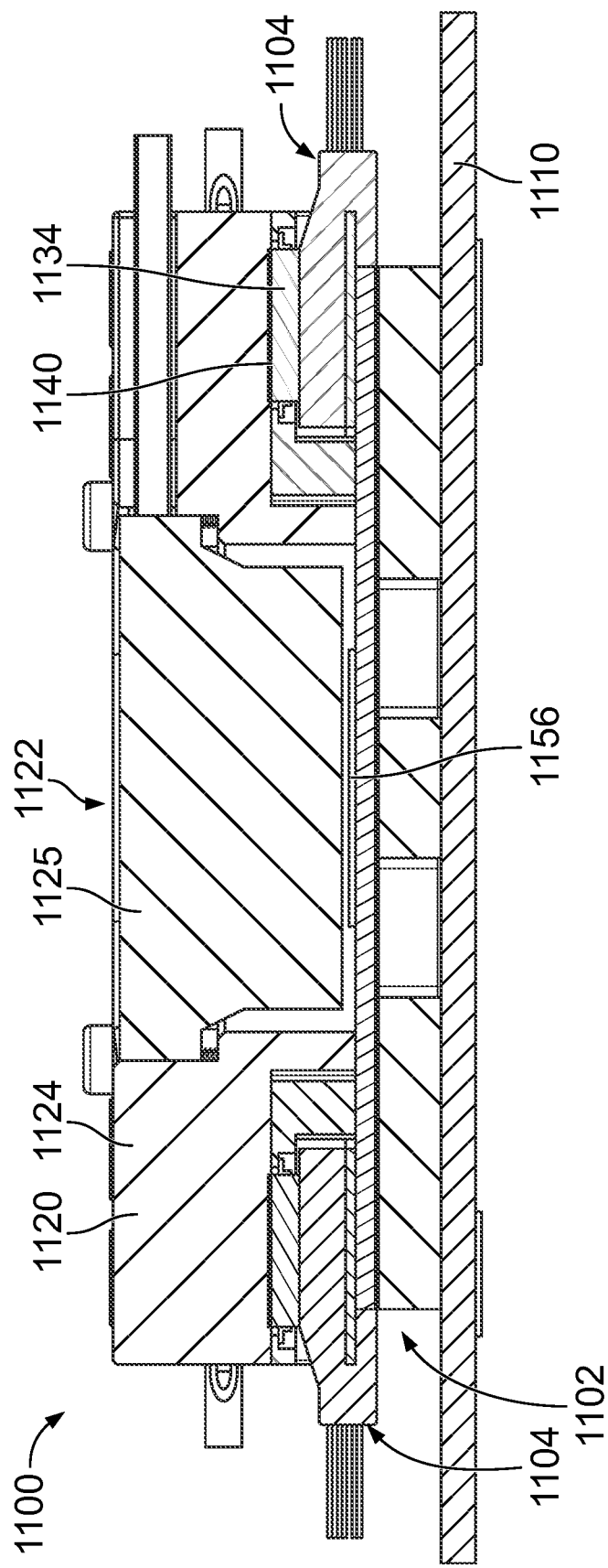
FIG. 26 is a cross-sectional view of a portion of the communication system showing the electronic assembly coupled to the host circuit board in accordance with an exemplary embodiment.

FIG. 26 is a cross-sectional view of a portion of the communication system 1100 showing the electronic assembly 1102 coupled to the host circuit board 1110. FIG. 26 shows the heat transfer element 1122 (for example, the load plate 1120) thermally coupled to the bridge assemblies 1134 and the integrated circuit component 1156. The heat transfer element 1122 dissipates heat from the cable connector modules 1104 and the integrated circuit component 1156.

In an exemplary embodiment, the heat transfer element 1122 is a cold plate and may be referred to hereinafter as cold plate 1122. In the illustrated embodiment, the cold plate 1122 is a multi-piece cold plate including an outer cold plate 1124 and an inner cold plate 1125 received in the outer cold plate 1124 The inner cold plate 1125 is movable relative to the outer cold plate 1124. The inner cold plate 1125 is compressible against the integrated circuit component 1156. The inner cold plate 1125 has a thermal interface at a bottom surface of the inner cold plate 1125. The thermal interface is compressed against the upper surface of the integrated circuit component 1156 to dissipate heat from the integrated circuit component 1156. The outer cold plate 1124 holds the bridge assemblies 1134. The outer cold plate 1124 is compressible against the bridge assemblies 1134 to press the bridge assemblies 1134 against the cable connector modules 1104. The outer cold plate 1124 includes a thermal interface at the bottom of the outer cold plate 1124 thermally coupled to the plates 1140 of the bridge assemblies 1134.

Figure 27:
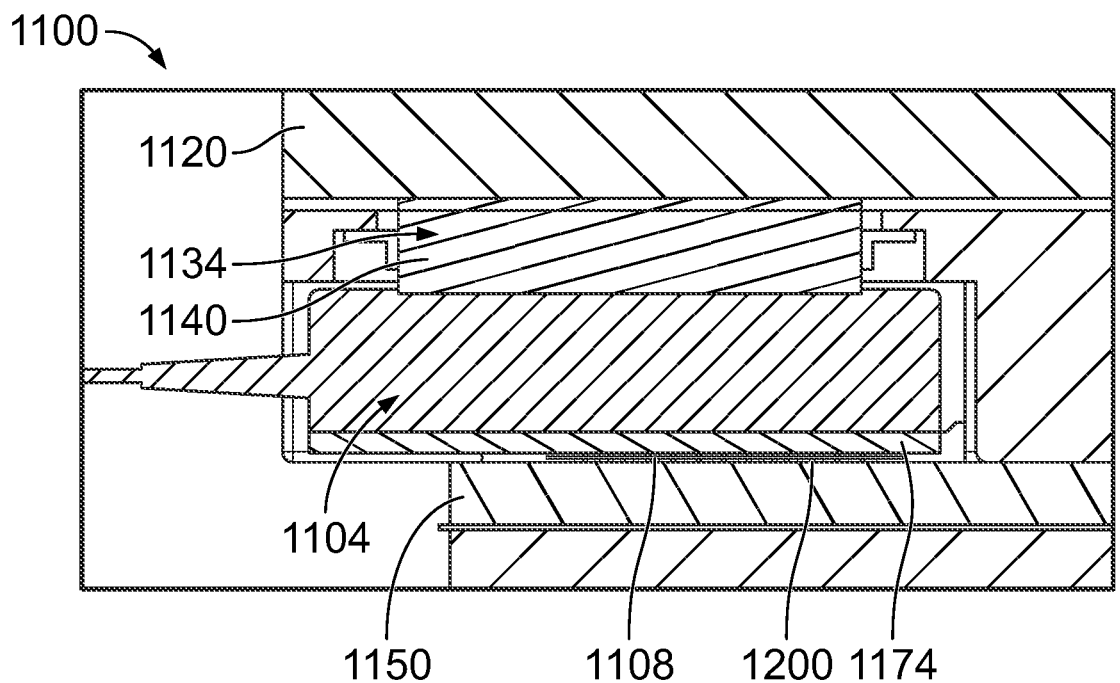
FIG. 27 is a cross-sectional view of a portion of the communication system in accordance with an exemplary embodiment.

FIG. 27 is a cross-sectional view of a portion of the communication system 1100. FIG. 27 shows the load plate 1120 mechanically coupled to the bridge assembly 1134. The bridge assemblies 1134 are pressed downward against the cable connector modules 1104 by the load plate 1120. For example, the individual plates 1140 are pressed against the top of the connector module housing 1170. The pressure on the cable connector module 1104 is transferred to the interposer assembly 1108. For example, the connector module substrate 1174 compresses the interposer contacts 1200 between the connector module substrate 1174 and the package substrate 1150 to maintain electrical connection between the connector module substrate 1174 and the interposer contacts 1200 and between the package substrate 1150 and the interposer contacts 1200. The bridge assemblies 1134 create a reliable electrical connection between the cable connector module 1104 and the interposer assembly 1108 and create a reliable electrical connection between the interposer assembly 1108 and the package substrate 1150. The interposer contacts 1200 are compressed between the cable connector module 1104 and the package substrate 1150.

FIGS. 28-36 illustrate assembly of the communication system 1100 in accordance with an exemplary embodiment.

Figure 28:
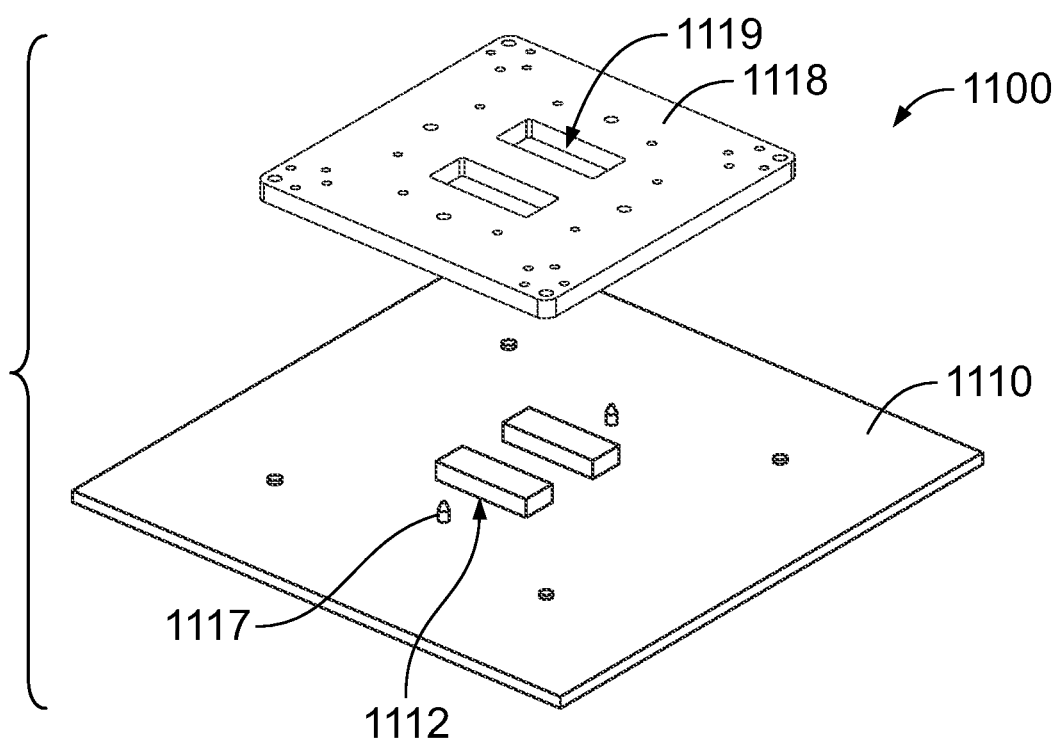
FIGS. 28-36 illustrate assembly of the communication system in accordance with an exemplary embodiment.

FIG. 28 is a perspective view of a portion of the communication system 1100 during assembly. FIG. 28 shows the bolster plate 1118 poised for coupling to the circuit board 1110. Alignment pins 1117 may be used to orient the bolster plate 1118 relative to the host circuit board 1110. In an exemplary embodiment, the bolster plate 1118 includes openings 1119 that receive the board connectors 1112.

Figure 29:
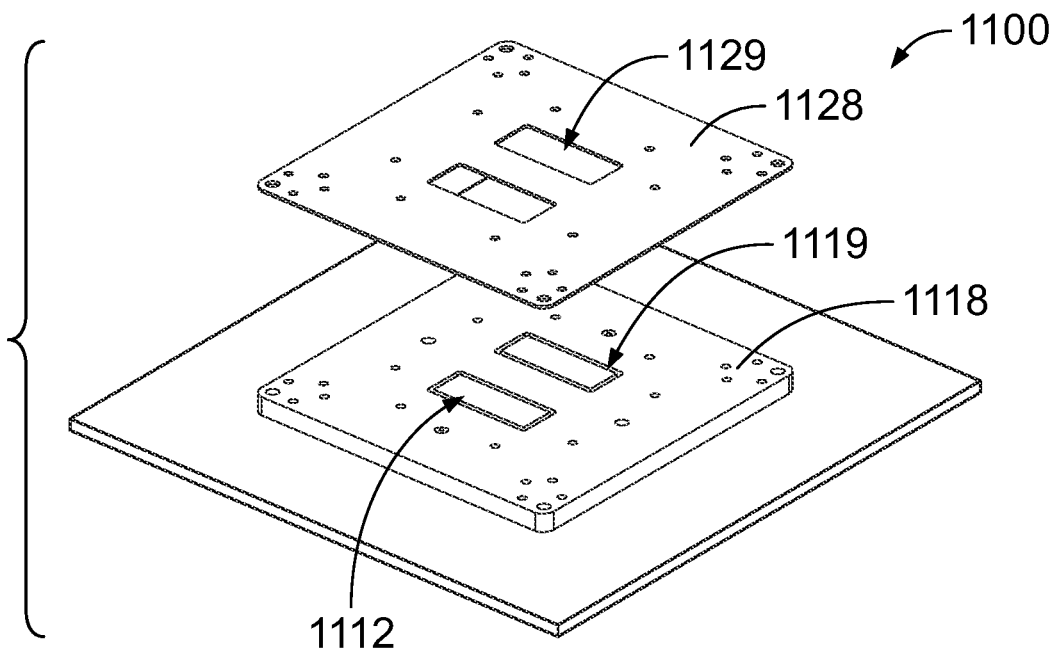

FIG. 29 is a perspective view of a portion of the communication system 1100 during assembly. FIG. 29 shows the insulator 1128 poised for coupling to the bolster plate 1118. The insulator 1128 includes openings 1129 configured to be aligned with the openings 1119 of the bolster plate 1118 to receive the board connectors 1112. The insulator 1128 may be a film or sheet manufactured from a dielectric material.

Figure 30:
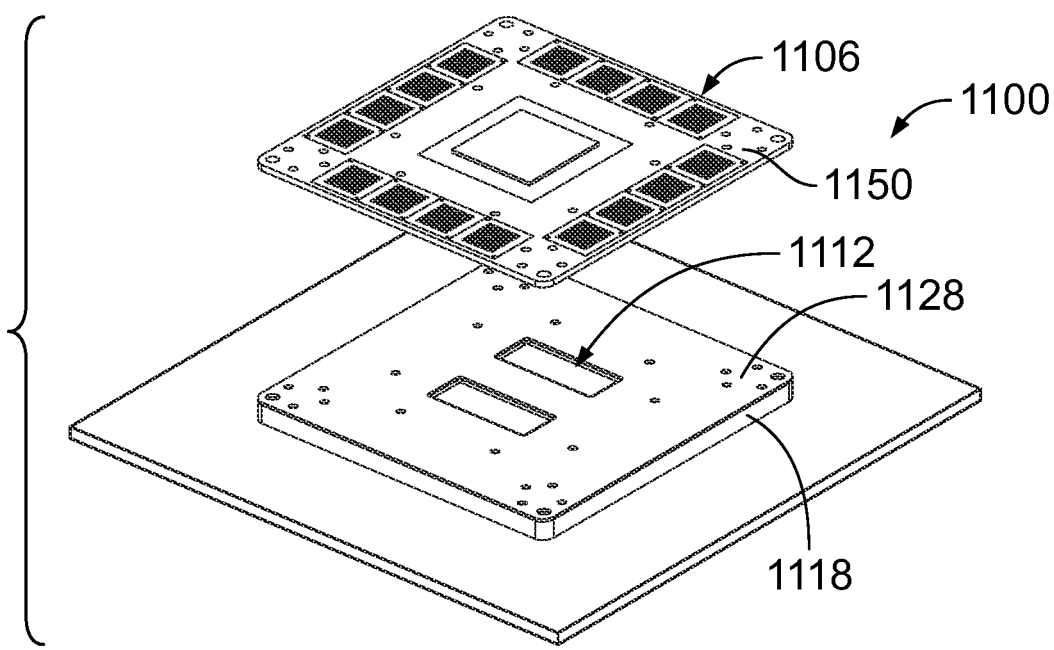

FIG. 30 is a perspective view of a portion of the communication system 1100 during assembly. FIG. 30 shows the electronic package 1106 poised for coupling to the insulator 1128 and the bolster plate 1118. The package substrate 1150 may be sized and shaped similar to the insulator 1128 and the bolster plate 1118. For example, the package substrate 1150 may be rectangular. The electronic package 1106 is configured to be electrically connected to the board connectors 1112.

Figure 31:
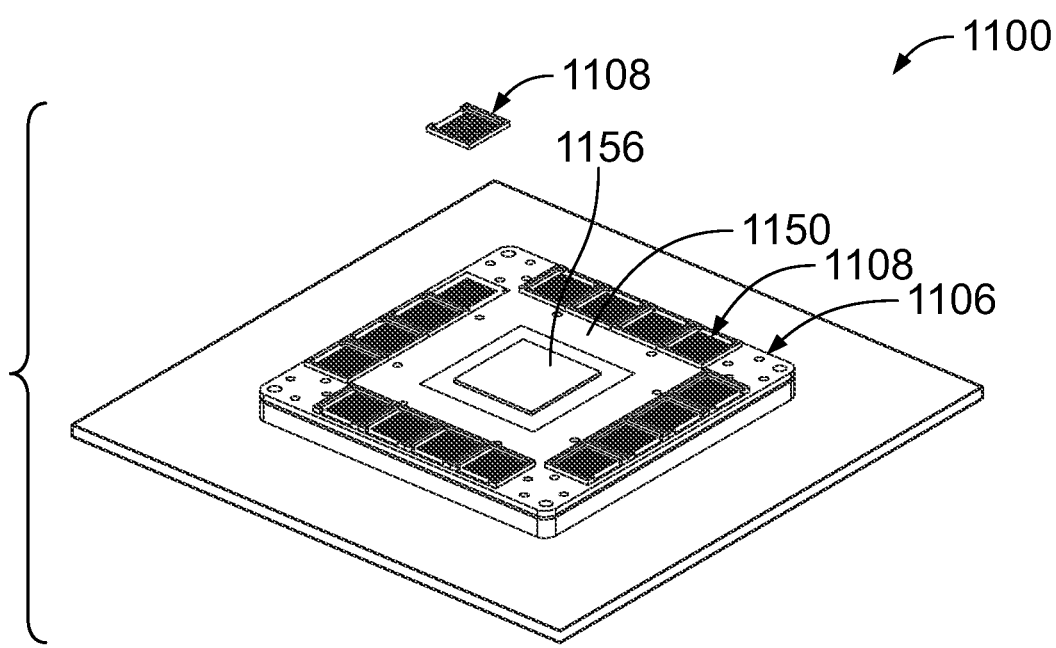

FIG. 31 is a perspective view of a portion of the communication system 1100 during assembly. FIG. 31 shows the interposer assemblies 1108 coupled to the package substrate 1150 of the electronic package 1106. In the illustrated embodiment, the interposer assemblies 1108 are provided on all four sides of the integrated circuit component 1156. Alignment features of the interposer assemblies 1108 may be used to align the interposer assemblies 1108 with the package substrate 1150.

Figure 32:
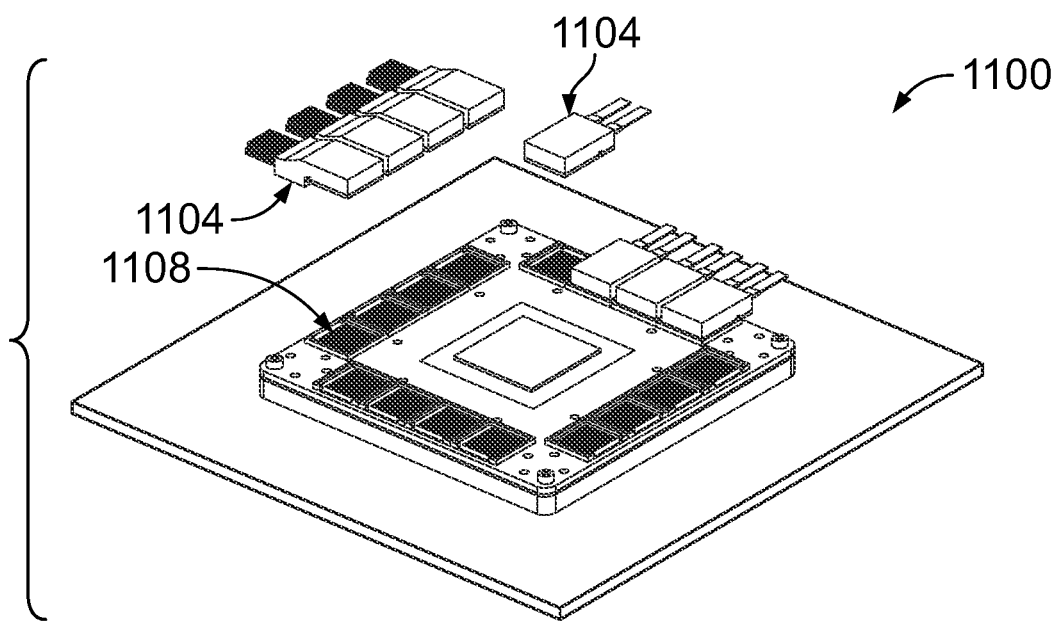

FIG. 32 is a perspective view of a portion of the communication system 1100 during assembly. FIG. 32 shows the cable connector modules 1104 coupled to the interposer assemblies 1108. The cable connector modules 1104 may be coupled to the interposer assemblies 1108 from above. Alignment features of the cable connector modules 1104 and the interposer assemblies 1108 are used to align the cable connector modules 1104 with the interposer assemblies 1108.

Figure 33:
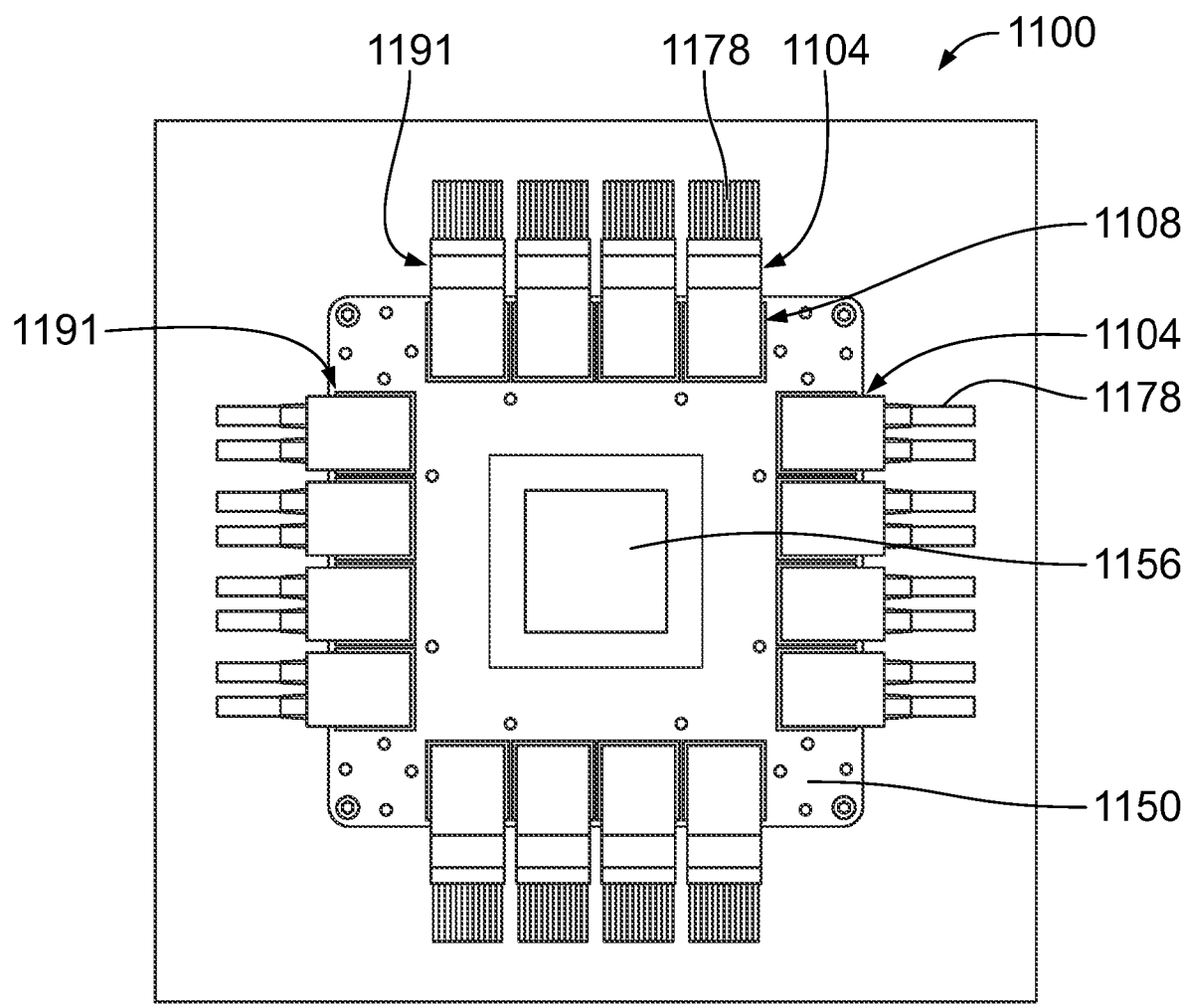

FIG. 33 is a top view of a portion of the communication system 1100 during assembly. FIG. 33 shows the cable connector modules 1104 coupled to the interposer assemblies 1108. In the illustrated embodiment, the cable connector modules 1104 are arranged in the connector module sets 1191 on all four sides of the integrated circuit component 1156. The cables 1178 extend outward in all four directions from the package substrate 1150.

Figure 34:
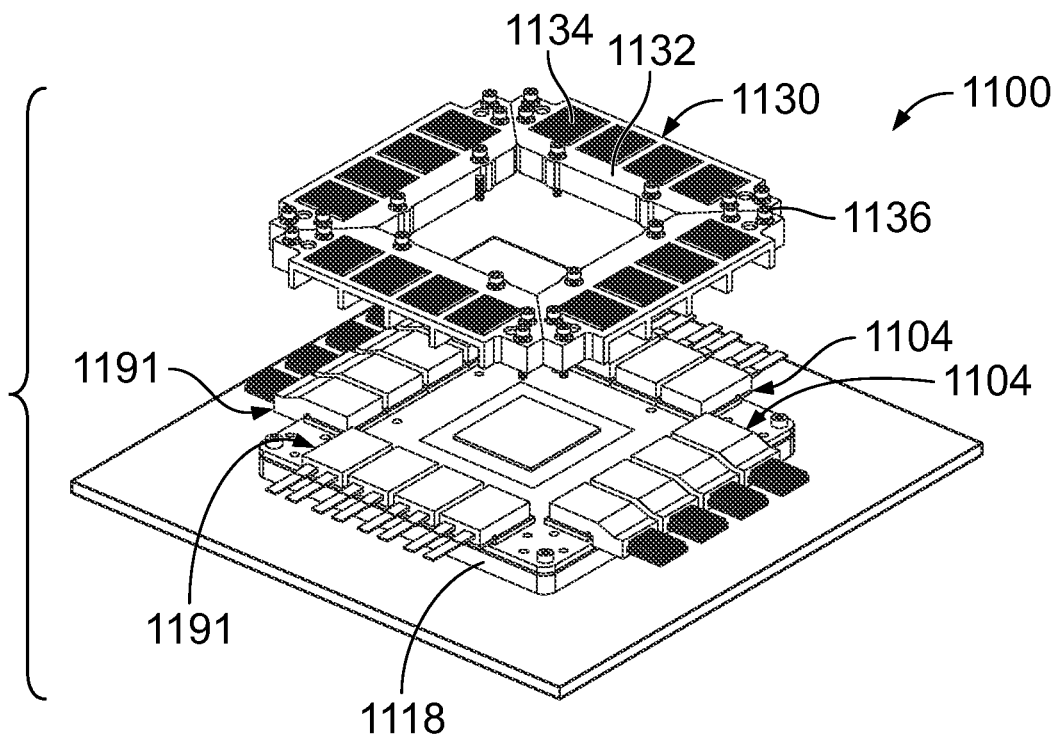

FIG. 34 is a perspective view of a portion of the communication system 1100 during assembly. FIG. 34 shows the cover assemblies 1130 poised for coupling to the cable connector modules 1104. In an exemplary embodiment, separate cover assemblies 1130 are provided for each connector module set 1191. The fasteners 1136 are used to secure the covers 1132 to the bolster plate 1118. The covers 1132 align the bridge assemblies 1134 with the cable connector modules 1104.

Figure 35:
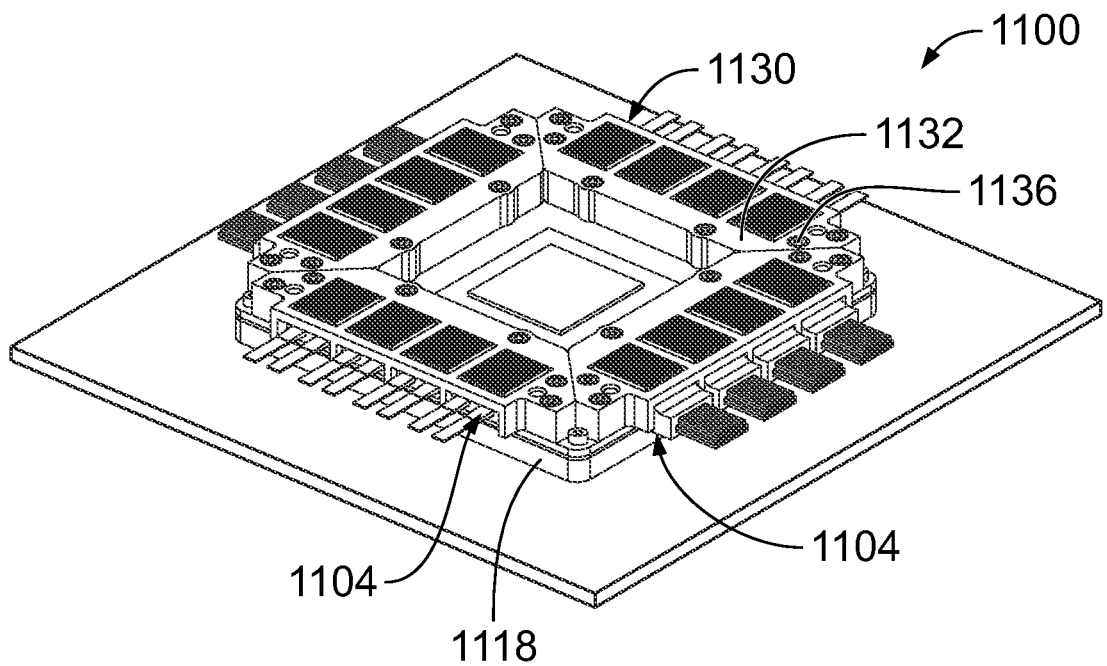

FIG. 35 is a perspective view of a portion of the communication system 1100 during assembly. FIG. 35 shows the cover assemblies 1130 coupled to the bolster plate 1118 over the cable connector modules 1104. The fasteners 1136 secure the covers 1132 in place.

Figure 36:
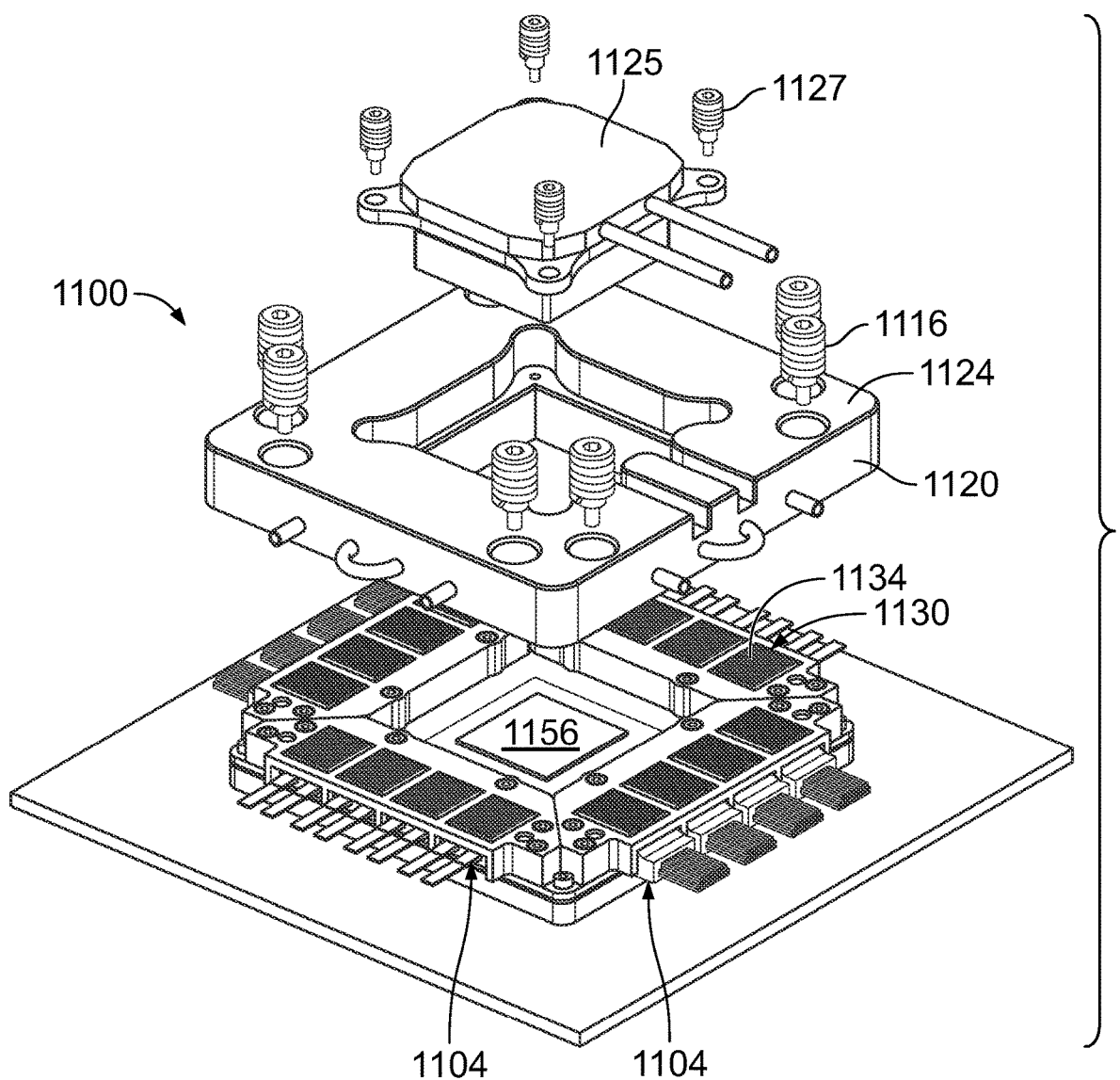

FIG. 36 is a perspective view of a portion of the communication system 1100 during assembly. FIG. 36 shows the load plate 1120 poised for coupling to the cover assemblies 1130. The load plate 1120 is secured to the cover assemblies 1130 using the compression hardware 1116. In the illustrated embodiment, the load plate 1120 includes the outer cold plate 1124 and an inner cold plate 1125. The inner cold plate 1125 is received in a pocket at a center of the outer cold plate 1124. The inner cold plate 1125 may be secured to the outer cold plate 1124 using compression hardware 1127. The inner cold plate 1125 is used for cooling the integrated circuit component 1156. The outer cold plate 1124 is used for cooling the cable connector modules 1104. For example, the outer cold plate 1124 may be thermally coupled to the cable connector modules 1104 via the thermal bridge is defined by the bridge assemblies 1134. When the load plate 1120 is secured to the cover assemblies 1130, the load plate 1120 is pressed against the bridge assemblies 1134. The load plate 1120 compresses the bridge assemblies 1134 against the cable connector modules 1104, which compresses the interposer contacts 1200 of the interposer assemblies 1108.

Figure 37:
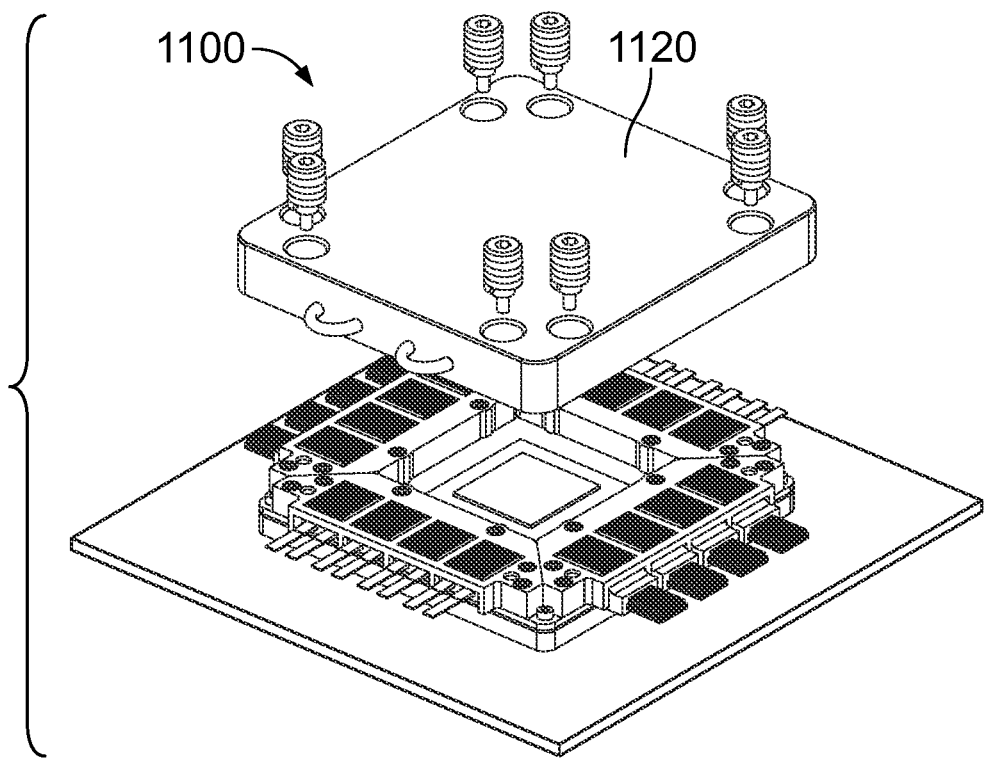
FIG. 37 is a perspective view of a portion of the communication system during assembly in accordance with an exemplary embodiment.

FIG. 37 is a perspective view of a portion of the communication system 1100 during assembly. FIG. 37 illustrates the load plate 1120 as a single piece cold plate rather than having the inner cold plate 1125 and the outer cold plate 1124 (shown in FIG. 36).

Figure 38:
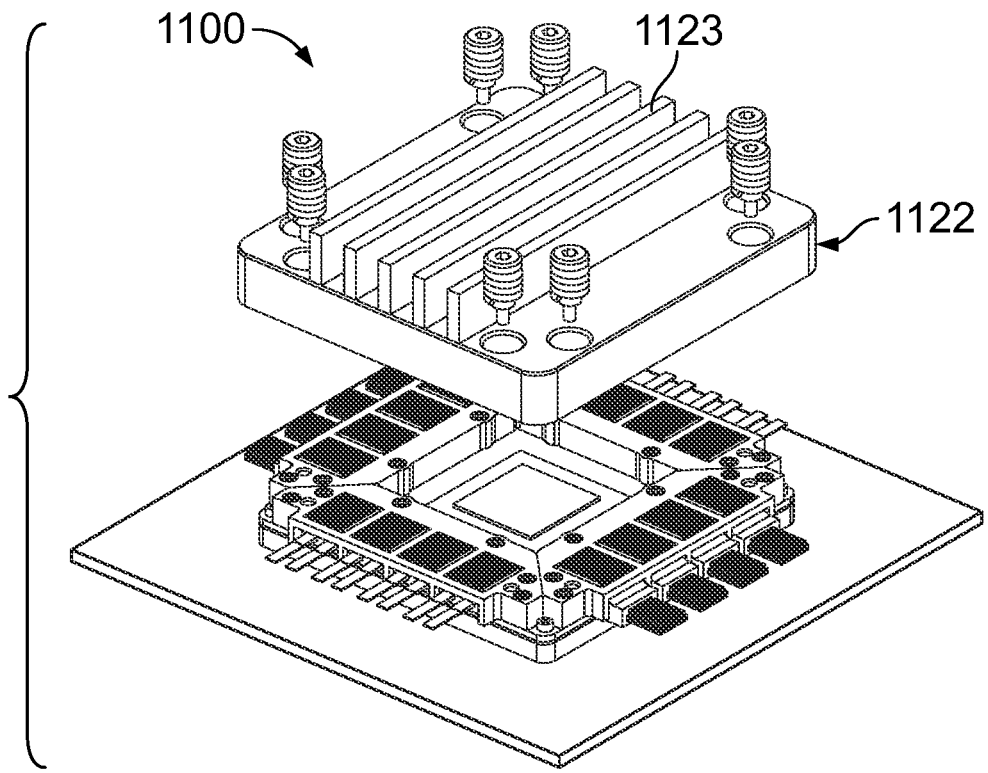
FIG. 38 is a perspective view of a portion of the communication system during assembly in accordance with an exemplary embodiment.

FIG. 38 is a perspective view of a portion of the communication system 1100 during assembly. FIG. 37 illustrates the load plate 1120 as a heatsink 1121 rather than a cold plate. The heat sink 1121 includes heat dissipating fins 1123 at the top of the heat sink 1121. Airflow channels are defined between the heat dissipating fins 1123. The heat sink 1121 is cooled by airflow that flows through the airflow channels to dissipate heat from the heat dissipating fins 1123.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An electronic assembly comprising:
   an electronic package including a package substrate having an upper surface and a lower surface, the electronic package including an integrated circuit component electrically connected to the package substrate, the electronic package includes lower package contacts electrically connected to the integrated circuit component and configured to be electrically connected to a host circuit board, the electronic package includes upper package contacts electrically connected to the integrated circuit component;
   interposer assemblies electrically connected to the electronic package, each interposer assembly including an array of interposer contacts, the interposer contacts being compressible, each interposer contact having an upper mating interface and a lower mating interface, the lower mating interfaces of the interposer contacts are mated with the corresponding upper package contacts, the interposer assemblies defining separable interfaces with the electronic package;
   cable connector modules coupled to the interposer assemblies, each cable connector module including a cable connector housing holding a connector module substrate, wherein the cable connector module is configured to have a cable communicatively coupled to the connector module substrate and extend from the cable connector housing, the connector module substrate having cable connector module contacts, the cable connector module contacts being mated with the upper mating interfaces of the corresponding interposer contacts;
   at least one cover assembly coupled to the upper surface of the electronic package, the cover assembly including a cover having a plate and walls extending from the plate to form at least one connector module cavity configured to receive the corresponding cable connector module, the plate including at least one window associated with the at least one connector module cavity, the cover assembly including at least one bridge assembly received in the corresponding connector module cavity and extending through the corresponding window, each bridge assembly having a plurality of plates arranged in a plate stack, the plates including upper edges and lower edges, the lower edges engaging the cable connector module housing; and
   a load plate coupled to the cover assembly, the load plate having a bottom surface engaging the upper edges of the plates of the bridge assemblies, wherein the load plate presses against the plates of the bridge assemblies to drive the bridge assemblies into the cable connector modules, the cable connector modules compressing the interposer contacts of the interposer assemblies when the load plate presses the plates of the bridge assemblies into the cable connector modules.

2. The electronic assembly of claim 1, wherein the plates of the bridge assemblies are thermally conductive, the plates transferring heat from the cable connector modules to the load plate.

3. The electronic assembly of claim 1, wherein the load plate is a cold plate having cooling channels, the bridge assemblies being thermally coupled between the cable connector modules and the cold plate.

4. The electronic assembly of claim 3, wherein the cold plate includes an outer cold plate and an inner cold plate received in the outer cold plate and movable relative to the outer cold plate, the inner cold plate being compressible against the integrated circuit component, the outer cold plate holding the bridge assemblies and being compressible against the cable connector modules.

5. The electronic assembly of claim 4, wherein the inner cold plate and the outer cold plate have different compressive forces.

6. The electronic assembly of claim 4, wherein the inner cold plate and the outer cold plate are operable at different temperatures.

7. The electronic assembly of claim 1, wherein the load plate is a heatsink having heat dissipating fins, the bridge assemblies being thermally coupled between the cable connector modules and the heat sink.

8. The electronic assembly of claim 1, wherein the cable connector module comprises a cable, the cable being a fiber optic cable, the cable connector module including an optical engine to communicatively couple the fiber optic cable and the connector module substrate.

9. The electronic assembly of claim 1, wherein the cable connector module comprises a cable, the cable being a copper conductor cable, multiple copper conductor cables being terminated to the connector module substrate.

10. The electronic assembly of claim 1, wherein each bridge assembly includes a frame holding the corresponding plates in the plate stack, the frame being mounted to the plate of the cover, the plates being movable relative to the frame and the cover.

11. The electronic assembly of claim 1, further comprising a bolster plate, the electronic package being coupled to the bolster plate, the cover being coupled to the bolster plate by fasteners with the interposer assemblies and the cable connector modules sandwiched between the package substrate and the cover.

12. The electronic assembly of claim 1, wherein the interposer contacts include conductive polymer contacts held in the array by a support plate, the upper mating interfaces be located above the support plate, the lower mating interfaces being located below the support plate.

13. The electronic assembly of claim 1, wherein the upper mating interfaces are compressible and the lower mating interfaces are compressible, the compression forces being transferred to the interposer contacts from the load plate through the bridge assemblies and the cable connector modules.

14. The electronic assembly of claim 1, wherein the interposer assembly includes an interposer frame holding a support plate, the support plate holding the interposer contacts in the array, the interposer frame including lower locating pins engaging the package substrate to locate the interposer assembly relative to the upper package contacts, the interposer frame including upper locating features engaging the cable connector module to locate the cable connector module relative to the interposer contacts.

15. The electronic assembly of claim 14, wherein the upper locating features include locating walls, the cable connector housing including locating slots receiving the locating walls to position the cable connector module in the interposer frame.

16. The electronic assembly of claim 1, wherein the package substrate includes edges around a perimeter of the package substrate, the package substrate including mounting areas between the integrated circuit component and the edges, each mounting area receiving one of the cover assemblies, each cover assembly receiving a plurality of the cable connector modules and a plurality of the interposer assemblies, the load plate engaging each of the cover assemblies.

17. The electronic assembly of claim 1, wherein each cover includes multiple cable contact cavities and holds multiple bridge assemblies for mating with multiple interposer assemblies.

18. The electronic assembly of claim 1, wherein the plates of the bridge assembly include upper plates and lower plates movable relative to each other.

19. A compression assembly for an electronic package of a communication system, the compression assembly comprising:
- at least one cover assembly configured to be coupled to an upper surface of the electronic package over interposer assemblies and cable connector modules coupled to the upper surface of the electronic package, each cover assembly including a cover having a plate and walls extending from the plate to form at least one connector module cavity configured to receive the corresponding cable connector module, the plate including at least one window associated with the corresponding connector module cavity;
- bridge assemblies received in corresponding connector module cavities and extending through the corresponding windows, each bridge assembly having a plurality of plates arranged in a plate stack, the plates including upper edges and lower edges, the lower edges configured to engage the cable connector module housing; and
- a load plate coupled to the at least one cover assembly using compression hardware that imparts a compression force, the load plate having a bottom surface engaging the upper edges of the plates of the bridge assemblies, wherein the load plate presses against the plates of the bridge assemblies with the compression force to drive the bridge assemblies into the cable connector modules, the compression force configured to compress interposer contacts of the interposer assemblies when the load plate presses the plates of the bridge assemblies into the cable connector modules.

20. The compression assembly of claim 19, wherein the plates of the bridge assemblies are thermally conductive, the plates transferring heat from the cable connector modules to the load plate.

21. The compression assembly of claim 19, wherein the load plate is a cold plate having cooling channels, the bridge assemblies being thermally coupled between the cable connector modules and the cold plate.

22. The compression assembly of claim 21, wherein the cold plate includes an outer cold plate and an inner cold plate received in the outer cold plate and movable relative to the outer cold plate, the inner cold plate configured to be compressible against the integrated circuit component, the outer cold plate holding the bridge assemblies and configured to be compressible against the cable connector modules, the inner cold plate and the outer cold plate having different compressive forces.

23. The compression assembly of claim 19, wherein each bridge assembly includes a frame holding the corresponding plates in the plate stack, the frame being mounted to the plate of the cover, the plates being movable relative to the frame and the cover.

24. The compression assembly of claim 19, wherein each cover includes multiple cable contact cavities and holds multiple bridge assemblies for mating with multiple interposer assemblies.

25. A communication system comprising:
- a host circuit board having an upper surface, the host circuit board including board contacts, the host circuit board including a board connector electrically coupled to the board contacts;
- a bolster plate coupled to the host circuit board; and
- an electronic assembly coupled to at least one of the host circuit board and the bolster plate, the electronic assembly comprising:
- an electronic package including a package substrate having an upper surface and a lower surface, the electronic package including an integrated circuit component on the upper surface of the package substrate, the electronic package includes lower package contacts electrically connected to the integrated circuit component, the lower package contacts being electrically connected to the board connector, the electronic package includes upper package contacts electrically connected to the integrated circuit component;
- interposer assemblies electrically connected to the electronic package, each interposer assembly including an array of interposer contacts, the interposer contacts being compressible, each interposer contact having an upper mating interface and a lower mating interface, the lower mating interfaces of the interposer contacts are mated with the corresponding upper package contacts, the interposer assemblies defining separable interfaces with the electronic package;
- cable connector modules coupled to the interposer assemblies, each cable connector module including a cable connector housing holding a connector module substrate, wherein the cable connector module is configured to have a cable communicatively coupled to the connector module substrate and extend from the cable connector housing, the connector module substrate having cable connector module contacts, the cable connector module contacts being mated with the upper mating interfaces of the corresponding interposer contacts;

at least one cover assembly coupled to the upper surface of the electronic package, the cover assembly including a cover having a plate and walls extending from the plate to form at least one connector module cavity configured to receive the corresponding cable connector module, the plate including at least one window associated with the at least one connector module cavity, the cover assembly including at least one bridge assembly received in the corresponding connector module cavity and extending through the corresponding window, each bridge assembly having a plurality of plates arranged in a plate stack, the plates including upper edges and lower edges, the lower edges engaging the cable connector module housing; and a load plate coupled to the cover assembly, the load plate having a bottom surface engaging the upper edges of the plates of the bridge assemblies, wherein the load plate presses against the plates of the bridge assemblies to drive the bridge assemblies into the cable connector modules, the cable connector modules compressing the interposer contacts of the interposer assemblies when the load plate presses the plates of the bridge assemblies into the cable connector modules.

* * * * *